(12) United States Patent
Matsuzawa

(10) Patent No.: US 9,941,491 B2
(45) Date of Patent: Apr. 10, 2018

(54) METHOD OF MANUFACTURING DISPLAY DEVICE

(71) Applicant: Japan Display Inc., Tokyo (JP)

(72) Inventor: Komei Matsuzawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/632,485

(22) Filed: Jun. 26, 2017

(65) Prior Publication Data

US 2018/0034008 A1     Feb. 1, 2018

(30) Foreign Application Priority Data

Jul. 28, 2016   (JP) ................................. 2016-148487

(51) Int. Cl.
*H01L 21/84* (2006.01)
*H01L 51/56* (2006.01)
*H01L 51/00* (2006.01)

(52) U.S. Cl.
CPC .......... *H01L 51/56* (2013.01); *H01L 51/0002* (2013.01); *H01L 51/0017* (2013.01)

(58) Field of Classification Search
CPC .. H01L 51/56; H01L 51/0002; H01L 51/0017
See application file for complete search history.

(56) References Cited

U.S. PATENT DOCUMENTS

| 5,985,740 | A | * | 11/1999 | Yamazaki | ........... | H01L 21/2022 257/E21.133 |
| 6,312,979 | B1 | * | 11/2001 | Jang | .................... | H01L 21/2022 257/E21.133 |
| 6,465,287 | B1 | * | 10/2002 | Yamazaki | ........... | H01L 21/2022 257/E21.133 |
| 2003/0164674 | A1 | | 9/2003 | Imamura | | |

FOREIGN PATENT DOCUMENTS

JP    2008-165251 A1    7/2008

* cited by examiner

*Primary Examiner* — Richard Booth
(74) *Attorney, Agent, or Firm* — Typha IP LLC

(57) ABSTRACT

A manufacturing method of a display device is provided including forming a first insulation film above a region including a display region of a substrate, adsorbing organic molecules to approximately the entire first surface on the opposite side to the substrate of the first insulation film, removing the organic molecules adsorbed to a first region defined as an inner side region not reaching an end part of the first insulation film including the display region on the first surface of the first insulation film, forming a second insulation film in the first region removed of the organic molecules on the first insulation film, removing the organic molecules adsorbed in regions apart from the first region of the first insulation film, and forming a third insulation film contacting the first insulation film at an outer side of the second insulation film above the first insulation film and the second insulation film.

17 Claims, 20 Drawing Sheets

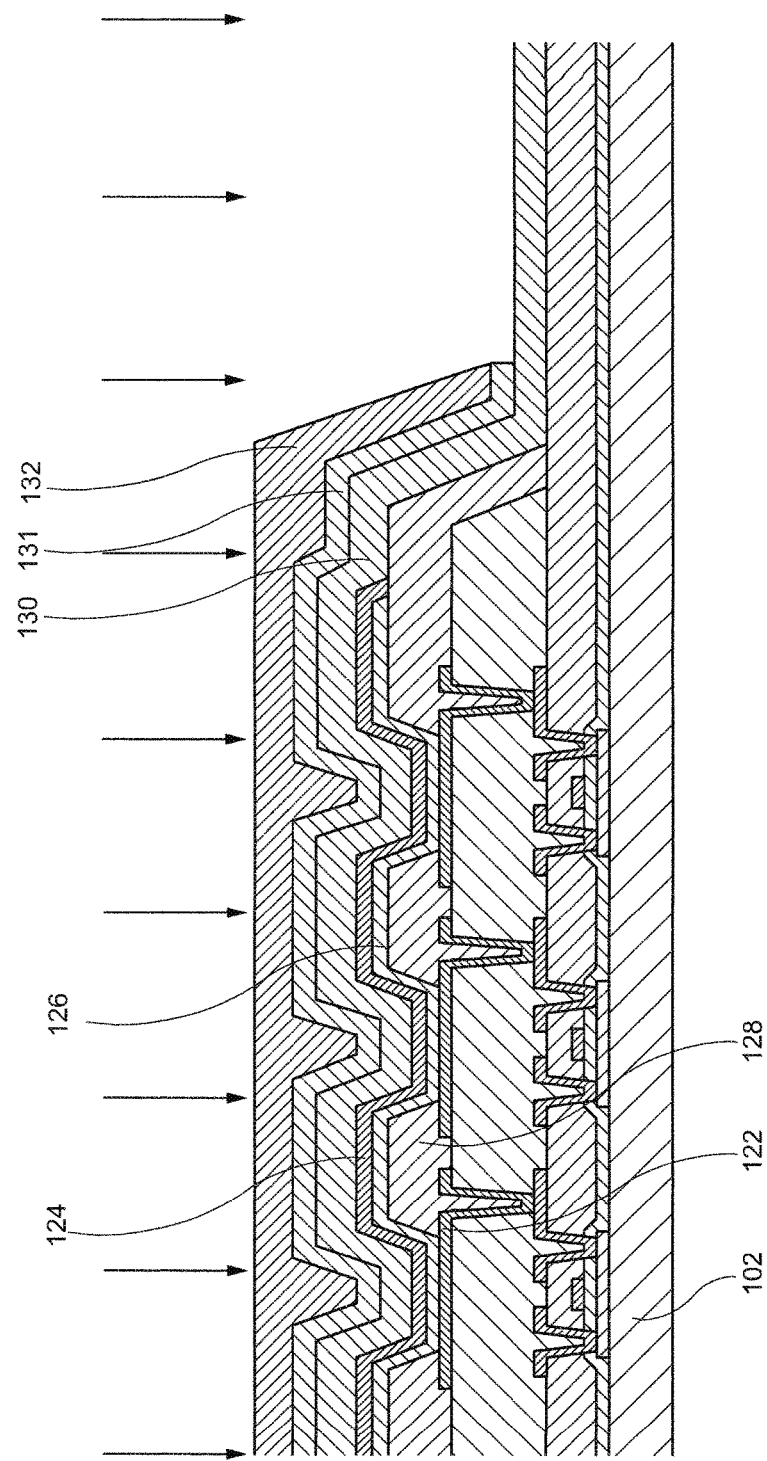

METHOD OF MANUFACTURING DISPLAY DEVICE

CROSS REFERENCE TO RELATED APPLICATIONS

This application is based upon and claims the benefit of priority from the prior Japanese Patent Application No. 2016-148487, filed on Jul. 28, 2016, the entire contents of which are incorporated herein by reference.

FIELD

The present invention is related to a manufacturing method of a display device.

BACKGROUND

A display device is arranged with a light emitting element in each pixel and displays an image by individually controlling emitted light. For example, in an organic EL display device using an organic EL element as a light emitting element, an organic EL element is arranged in each pixel and the organic EL element has a structure in which a layer including an organic EL material (referred to herein as [organic EL layer]) is sandwiched between a pair of electrodes comprised from an anode electrode and a cathode electrode. An organic EL display device is arranged with the anode electrode as an individual pixel electrode in each pixel, and the cathode electrode is arranged bridging a plurality of pixel as a common pixel electrode applied with a common potential. The organic EL display device controls light emitted from a pixel by applying the voltage of a pixel electrode to each pixel with respect to the potential of the common pixel electrode.

An organic EL layer is extremely weak to water and when water infiltrates from the exterior to the interior of a panel and reaches the organic EL layer, non-lighting regions called dark spots may be produced. Thus, in order to prevent water infiltrating to an organic EL layer, a measure has been adopted for forming a sealing film to cover a structure of a display region arranged with an organic EL element.

A structure in which mainly an organic insulation film, and a side surface and upper and lower surfaces of the organic insulation film are stacked with an inorganic insulation film is generally used as a sealing film. In order to prevent the infiltration of water in a side surface direction, it is necessary to seal an end part of a region arranged with the organic insulation film using the upper and lower surface inorganic insulation film. Enclosing a region for arranging an organic insulation film by a dam part and damming the organic insulation film on an inner side of the dam part as a method for determining the position of an end part is disclosed in Japanese Laid Open Patent Publication No. 2008-165251.

However, it has become necessary to significantly narrow a display region outer periphery part together with the narrowing of a frame in recent years and it has become increasingly difficult to control the position of an end part of an organic insulation film.

SUMMARY

According to one embodiment of the present invention, a manufacturing method of a display device is provided including forming a first insulation film above a region including a display region of a substrate having the display region arranged with a plurality of display elements, adsorbing organic molecules to approximately the entire first surface on the opposite side to the substrate of the first insulation film, removing the organic molecules adsorbed to a first region defined as an inner side region not reaching an end part of the first insulation film including the display region on the first surface of the first insulation film, forming a second insulation film in the first region removed of the organic molecules on the first insulation film, removing the organic molecules adsorbed in regions apart from the first region of the first insulation film, and forming a third insulation film contacting the first insulation film at an outer side of the second insulation film above the first insulation film and the second insulation film.

According to one embodiment of the present invention, a manufacturing method of a display device is provided including forming a first insulation film above a region including a display region of a substrate having the display region arranged with a plurality of display elements, adsorbing organic molecules to the first insulation film masking a first region defined as an inner side region not reaching an end part of the first insulation film including the display region on a first surface on the opposite side to the substrate of the first insulation film, forming a second insulation film in the first region unadsorbed with the organic molecules on the first insulation film, removing the organic molecules adsorbed in regions apart from the first region of the first insulation film, and forming a third insulation film contacting the first insulation film at an outer side of the second insulation film above the first insulation film and the second insulation film.

According to one embodiment of the present invention, a manufacturing method of a display device is provided including forming a first insulation film above a region including a display region of a substrate having the display region arranged with a plurality of display elements, forming an adhesion film on a first insulation film masking regions other than a first region defined as an inner side region not reaching an end part of the first insulation film including the display region on a first surface on the opposite side to the substrate of the first insulation film, forming a second insulation film in the first region formed with the adhesion film on the first insulation film, and forming a third insulation film contacting the first insulation film at an outer side of the second insulation film above the first insulation film and the second insulation film.

BRIEF DESCRIPTION OF DRAWINGS

FIG. 7D is a cross-sectional diagram showing a manufacturing method of a display device related to one embodiment of the present invention.

DESCRIPTION OF EMBODIMENTS

Figure 1:
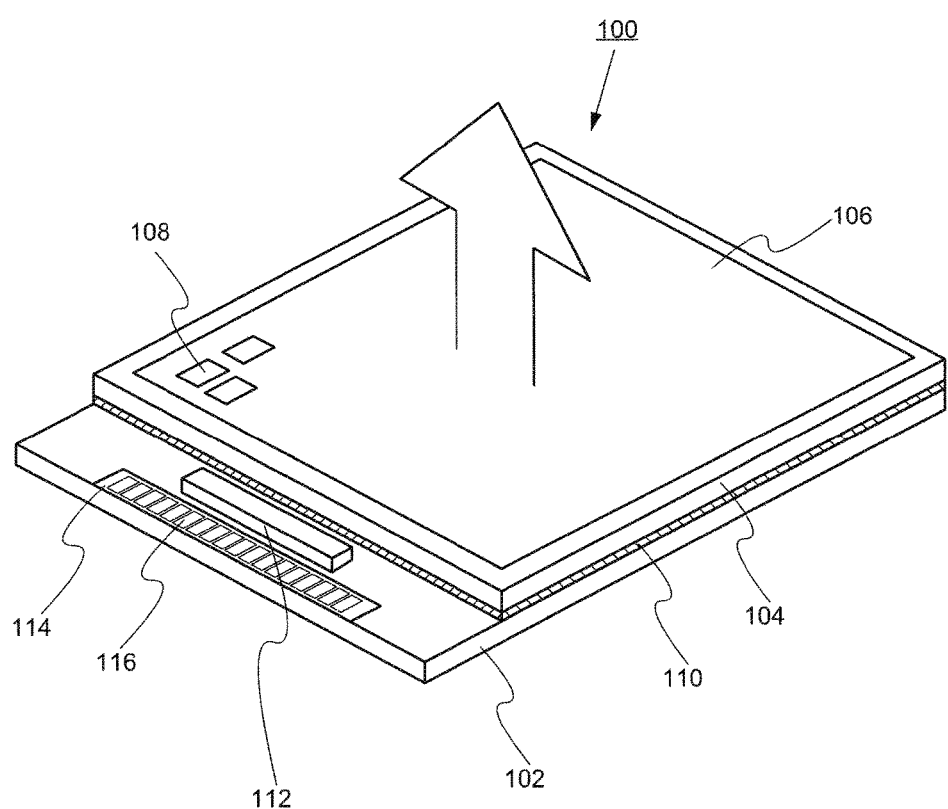
FIG. 1 is a perspective diagram showing an approximate structure of a display device manufactured using a manufacturing method related to one embodiment of the present invention.

A display device related to a number of embodiments of the present invention is explained in detail below while referring to the diagrams. However, it is possible to perform the present invention using many different forms and the present invention should not be limited to the content described in the embodiments exemplified herein. In the embodiments of the present invention, although an organic EL display device is particularly exemplified as a suitable application example, the present invention is not limited to an organic EL display device.

Although the width, thickness and shape of each component are shown schematically compared to their actual form in order to better clarify explanation, the drawings are merely an example and should not limit an interpretation of the present invention. In addition, the dimension ratios in the drawings may be different to actual ratios for the purposes of explanation and a part of the structure may be omitted from the drawings. In the specification and each drawing, the same reference symbols are attached to similar elements and elements that have been mentioned in previous drawings, and therefore a detailed explanation may be omitted where appropriate.

In the present specification, in the case where certain parts or regions are given as [above (or below)] other parts or regions, as long as there is no particular limitation, these include parts which are not only directly above (or directly below) other parts or regions but also in an upper direction (or lower direction). That is, in the case where certain parts or regions are given as [above (or below)] other parts or regions, other structural elements may be included between other parts or regions in an upper direction (or lower direction).

First Embodiment

FIG. 1 is a perspective diagram of a display device 100 related to the present embodiment. The structure of the display device 100 related to the present embodiment is explained while referring to FIG. 1. The display device 100 is arranged with a display region 106 in a first substrate 102. The display region 106 is formed by arranging a plurality of pixels 108. A second substrate 104 is arranged as a sealing material on the upper surface of the display region 106. For example, the second substrate 104 is fixed to the first substrate 102 by a sealing member 110 which encloses the display region 106. The display region 106 formed in the first substrate 102 is sealed so that it is not exposed to air by the second substrate 104 which is a sealing material and the sealing member 110. By such a sealing structure, degradation of a light emitting element arranged in a pixel is suppressed. Furthermore, the display region 106 may be fixed by a means other than the sealing member 110 when arranging the second substrate 104.

Figure 2:
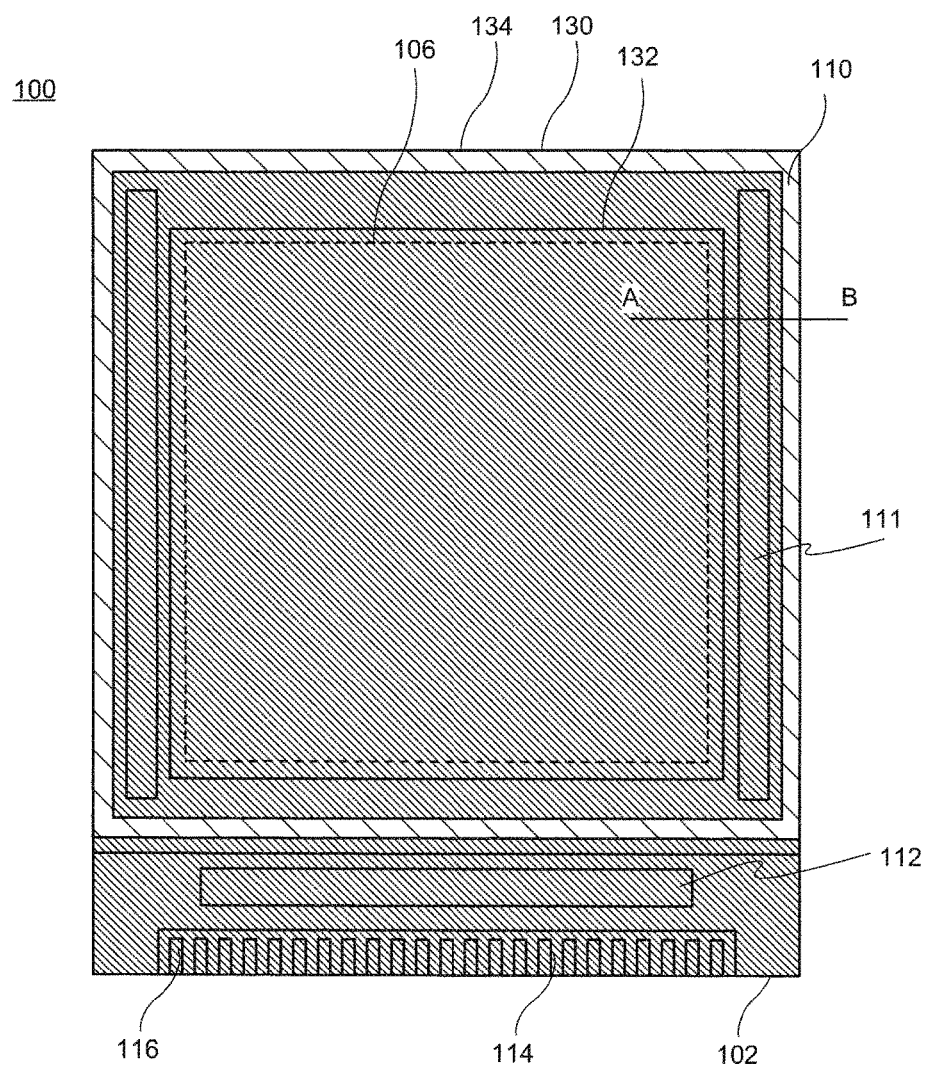
FIG. 2 is a planar view diagram showing an approximate structure of a display device manufactured using a manufacturing method related to one embodiment of the present invention.
Figure 3:
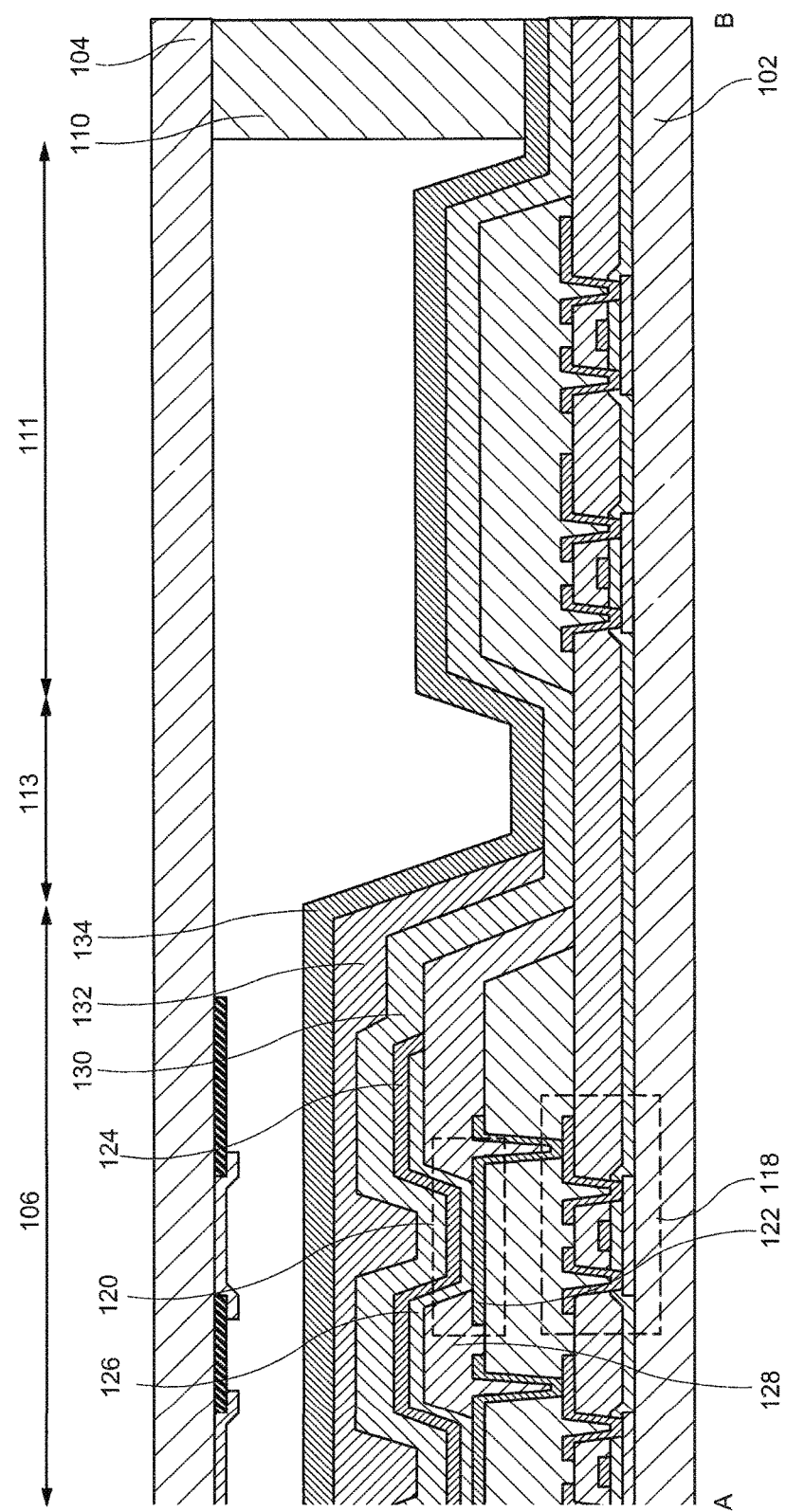
FIG. 3 is a cross-sectional diagram showing an approximate structure of a display device manufactured using a manufacturing method related to one embodiment of the present invention.

An approximate structure of the display device 100 related to the present embodiment is explained while referring to FIG. 2 and FIG. 3. FIG. 2 is a planar view diagram showing an approximate structure of the display device 100 manufactured using a manufacturing method related to the present embodiment.

FIG. 3 is a cross-sectional diagram showing an approximate structure of the display device 100 manufactured using a manufacturing method related to the present embodiment. FIG. 3 shows a cross-sectional view along the line A-B in FIG. 2.

The display device 100 related to the present embodiment is arranged with a display region 106 forming a display screen above the first substrate 102. A terminal region 114 is arranged at one end of the first substrate 102. The terminal region 114 is arranged at the outer side of the second substrate 104. The terminal region 114 is formed by a plurality of connection terminals 116. A connection terminal 116 forms a connection point with a wiring substrate for connecting devices which output an image signal or a power source and a display panel. This connection point in the connection terminal 116 is exposed to the exterior. A first drive circuit 111 and second drive circuit 112 which output an image signal input from the terminal region 114 to the display region 106 are arranged on the first substrate 102.

The display region 106, the first drive circuit 111 and the second drive circuit 112 are respectively connected by wiring. In addition to a pixel 108, the display region 106 is arranged with wiring called a scanning signal line and image signal line. Each pixel 108 of the display region 106 is connected with the first drive circuit 111 and second drive circuit 112 by this wiring. For example, the first drive circuit 111 is a drive circuit which outputs a scanning signal to the display region 106 and the second drive circuit 112 is a drive circuit which outputs an image signal to the display region 106. FIG. 3 shows a form in which a sealing region 113 is provided between the display region 106 and the first drive circuit 111.

As is shown in FIG. 3, each of the plurality of pixels of the display device 100 includes a transistor 118 and a light emitting element 120. The light emitting element 120 has a structure in which an individual pixel electrode 122 and a common pixel electrode 124 arranged opposing the individual pixel electrode 122 sandwich a light emitting layer 126. The individual pixel electrode 122 is arranged independently for each pixel and is connected with each transistor 118 respectively. The common pixel electrode 124 is applied with a common voltage across a plurality of pixels. However, the present embodiment is not limited thereto and the application of a potential to the common pixel electrode 124 may be performed for all the pixels or independently for some of the pixels.

A bank 128 is arranged between two adjacent pixels. The bank 128 is arranged so that an end part covers the periphery edge part of the individual pixel electrode 122. Since the bank 128 prevents short circuits with a common pixel electrode 124 at an end part of the individual pixel electrode 122 and insulates adjacent pixels, it is preferred that the bank 128 is formed using an insulation material. For example, it is preferred to use an organic material such as polyimide or acrylic or an inorganic material such as silicon oxide when forming the bank 128.

The display device 100 shown in the present embodiment has what is called a top-emission type structure in which light emitted by the light emitting element 120 is emitted to the common pixel electrode 124 side. Although a top-emission type structure is exemplified in the present embodiment, the present embodiment is not limited thereto and what is called a bottom-emission type structure can be applied in which light is emitted to the individual pixel electrode 122 side. The individual pixel electrode 122 is preferred to be formed from a metal with high reflectance in order to reflect light emitted by the light emitting layer 126 to the common pixel electrode 124 side. Alternatively, a structure in which the individual pixel electrode 122 is formed including a light reflecting surface by stacking a metal film and a transparent conductive film is also possible. On the other hand, the common pixel electrode 124 is preferred to be formed from a transparent conductive film such as ITO (Indium oxide added with tin) or IZO (indium oxide added with zinc) which have translucency and conductivity in order to allow light emitted by the light emitting layer 126 to pass through. Alternatively, the common pixel electrode 124 may be formed using a metal film to a thickness through which emitted light can pass through A sealing film is arranged in an upper part of the common pixel electrode 124. For example, in an organic EL display device which uses an organic EL element as the light emitting element 120, since the organic EL layer is extremely weak to water, light emission defects called dark spots can occur when water infiltrates the interior of a panel from the exterior and reaches the organic EL layer. Therefore, the sealing film is arranged to cover the display region 106. It is preferred that an insulation film which can block the infiltration of water is used in the sealing film and it is possible to use a plurality of films of an inorganic insulation material and organic insulation material. For example, in the case where an inorganic insulation material is used, it is possible to use a film such as silicon oxide ($SiO_x$), silicon nitride ($Si_xN_y$), silicon oxynitride ($SiO_xN_y$), silicon nitride oxide ($SiN_xO_y$), aluminum oxide ($Al_xO_y$), aluminum nitride ($Al_xN_y$), aluminum oxynitride ($Al_xO_yN_z$) and aluminum nitride oxide ($Al_xN_yO_z$) and the like (x, y and z are arbitrary). It is possible to use a plasma CVD method or sputtering method as a film formation method. In addition, it is possible to use a polyimide resin, acrylic resin, epoxy resin, silicone resin, fluororesin and siloxane resin and the like as the organic insulation material covering the inorganic insulation material described above. It is possible to use an inkjet method for example as the film formation method.

Furthermore, it is possible to use a structure in which the organic insulation layer and inorganic insulation layer described above are stacked. By adopting a structure in which an organic insulation layer and inorganic insulation layer are stacked, it is possible to expect further prevention of water infiltration. In the case of a stacked structure, it is desirable that an end part of the organic insulation layer is covered by the inorganic insulation layer.

In the present embodiment, the sealing film has a three-layer structure in which a first insulation film 130, second insulation film 132 and third insulation film 134 are arranged in this order from the bottom layer side. The three layers of the first insulation film 130, second insulation film 132 and third insulation film 134 are each arranged so as to cover the display region 106. That is, an end part of the first insulation film 130, second insulation film 132 and third insulation film 134 is arranged on the outer side of an end part of the display region 106.

It is possible to use an inorganic insulation material or an organic insulation material as the first insulation film 130. It is preferred that a film with high water blocking properties is used as the first insulation film 130 and use of an inorganic insulation layer is particularly preferred. For example, a silicon nitride film can be used. At this time, a single layer of just the first insulation film 130 may not be sufficiently used as a cover film due to concave and convex parts caused by the light emitting element 120 and the like within the display region 106 and a water transport path is sometimes produced.

Thus, the second insulation film 132 is arranged as a second layer in order to secure high flattening properties. It is possible to use an organic insulation material such as acrylic and the like as the second insulation film 132. As is shown in FIG. 3, although a region of the second insulation film 132 is included in the display region 106, the first drive circuit 111 is not included. That is, an end part of the second insulation film 132 is located within the sealing region 113 between the display region 106 and first drive circuit 111.

The third insulation film 134 is arranged above the second insulation film 132 with improved flattening properties. It is possible to provide the third insulation film 134 with high covering properties due to flattening of the second insulation film 132 and suppress the production of a water transport path. It is possible to use an inorganic insulation material or an organic insulation material as the third insulation film 134. The third insulation film 134 is preferred to be a film with particularly high water blocking properties, and the use of an inorganic insulation material such as silicon nitride for example is preferred.

Furthermore, a structure is adopted in the present embodiment in which the first insulation film 130 and third insulation film 134 cover the second insulation film 132 at an end part of the insulation films stacked in three layers. As is shown in FIG. 2 and FIG. 3, the first insulation film 130 and third insulation film 134 are larger than the second insulation film 132 and the first insulation film 130 and third insulation film 134 contact at an outer side of the second insulation film 132. By adopting such a structure, an end part of the second insulation film 132 in particular is prevented from being exposed. In the case where an organic insulation material is used as the second insulation film 132, when the end part thereof is exposed, it is likely to form an infiltration path for water to infiltrate from the exterior. There is concern that water infiltrating from an end part of the second insulation film 132 is transported to the light emitting element 120 which decreases the lifetime of the display device 100.

As in the present embodiment, by adopting a structure in which the first insulation film 130 and third insulation film 134 cover the second insulation film 132 at an end part of the insulation films stacked in three layers, it is possible to suppress the infiltration of water from an end part of an insulation film and provide a display device with high reliability. An end part of the second insulation film 132 is located within the sealing region 113 and this type of region is also called a "water blocking region". Furthermore, further improvement in resistance to water can be expected from a combination with a sealing structure by a conventional sealing member 110, and it is possible to provide a display device 100 with even higher reliability. In addition, it is possible to narrowly design the sealing region 113 using the structure of insulation films stacked in three layers as in the present embodiment and further narrow an outer periphery part of a display device <Manufacturing Method>

A manufacturing method of the display device 100 related to the present embodiment is explained while referring to FIG. 4A to FIG. 4F. Since it is possible to use the existing methods apart from the formation of a sealing film, such an explanation is omitted in the present embodiment, and a method for forming layers above the common pixel electrode 124 in the display region 106 and sealing region 113 is explained in the diagram.

Figure 4A:
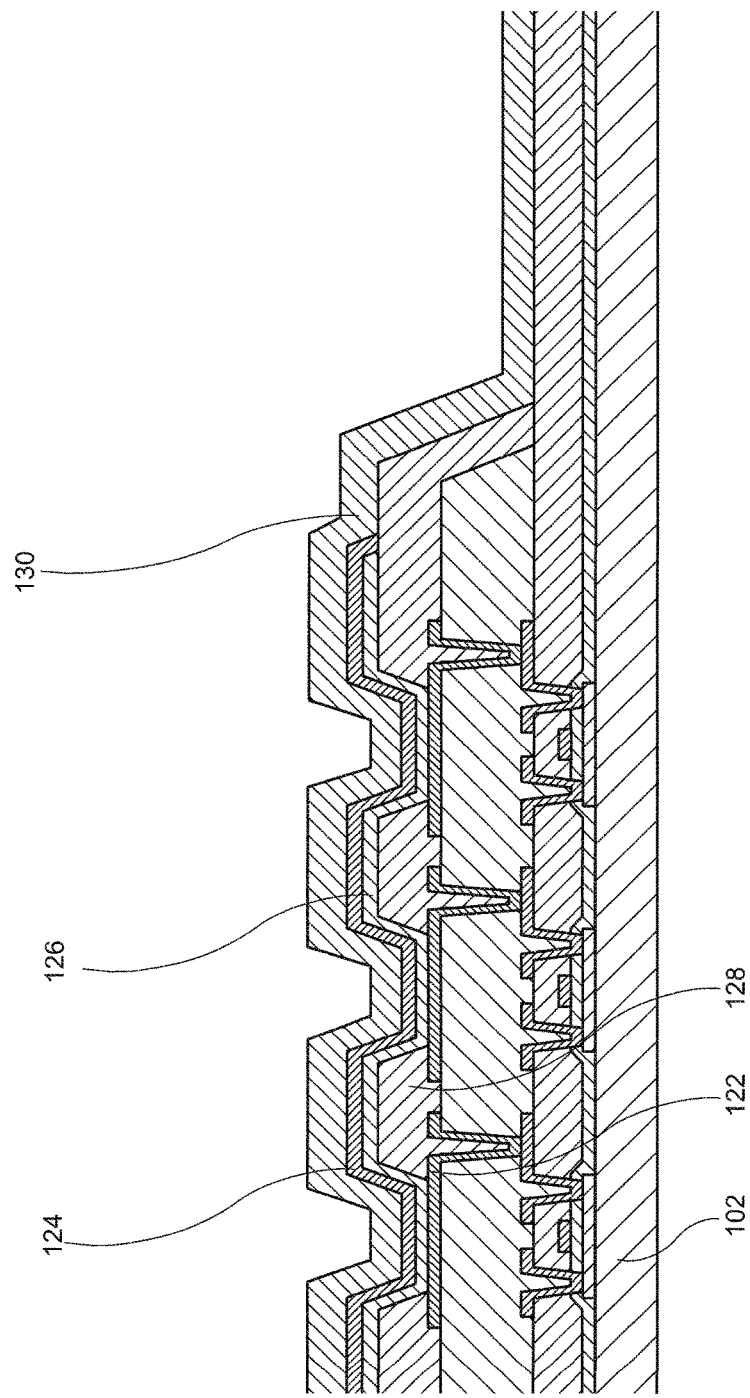
FIG. 4A is a cross-sectional diagram showing a manufacturing method of a display device related to one embodiment of the present invention.

First, the first insulation film 130 is formed. As is shown in FIG. 4A, the first insulation film 130 is formed above a film formation region of the first substrate 102 formed with circuits. In the present embodiment, a silicon nitride film is formed using a plasma CVD method. As is shown in FIG. 2 and FIG. 3, although the first insulation film 130 in the present embodiment is formed on approximately the entire surface of the first substrate 102 formed with circuits, the present embodiment is not limited thereto. The first insulation film 130 is formed to include at least the display region 106 and a part of sealing region 113.

Figure 4B:
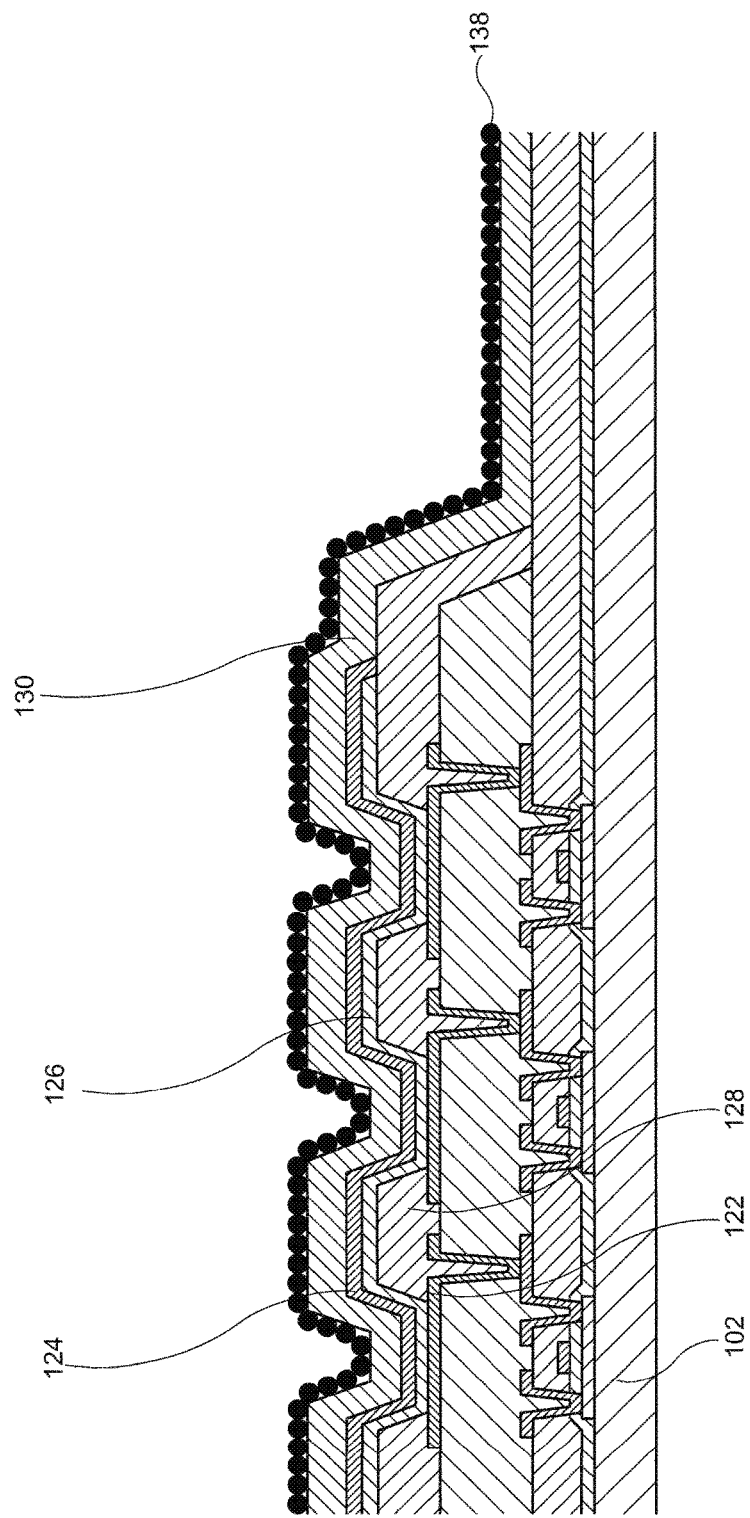
FIG. 4B is a cross-sectional diagram showing a manufacturing method of a display device related to one embodiment of the present invention.

Next, organic molecules 138 are adsorbed to approximately the entire surface above the first insulation film 130. As is shown in FIG. 4B, the surface of the first insulation film 130 is exposed to organic vapor and organic molecules 138 are adsorbed. Organic molecules such as phthalic ester, low molecular siloxane, phosphoric acid ester or dibutylhydroxytoluene and the like can be used as the material of the organic molecules. However, the present invention is not limited thereto, and a material with high adhesion to the first insulation film 130 which can be easily removed and has high liquid repellency to the second insulation film 132 is preferred as the organic molecules 138. By adsorbing the organic molecules 138 to the surface of the first insulation film 130, wettability of the second insulation film 132 material becomes poor and liquid repellency increases in the first insulation film 130.

Figure 4C:
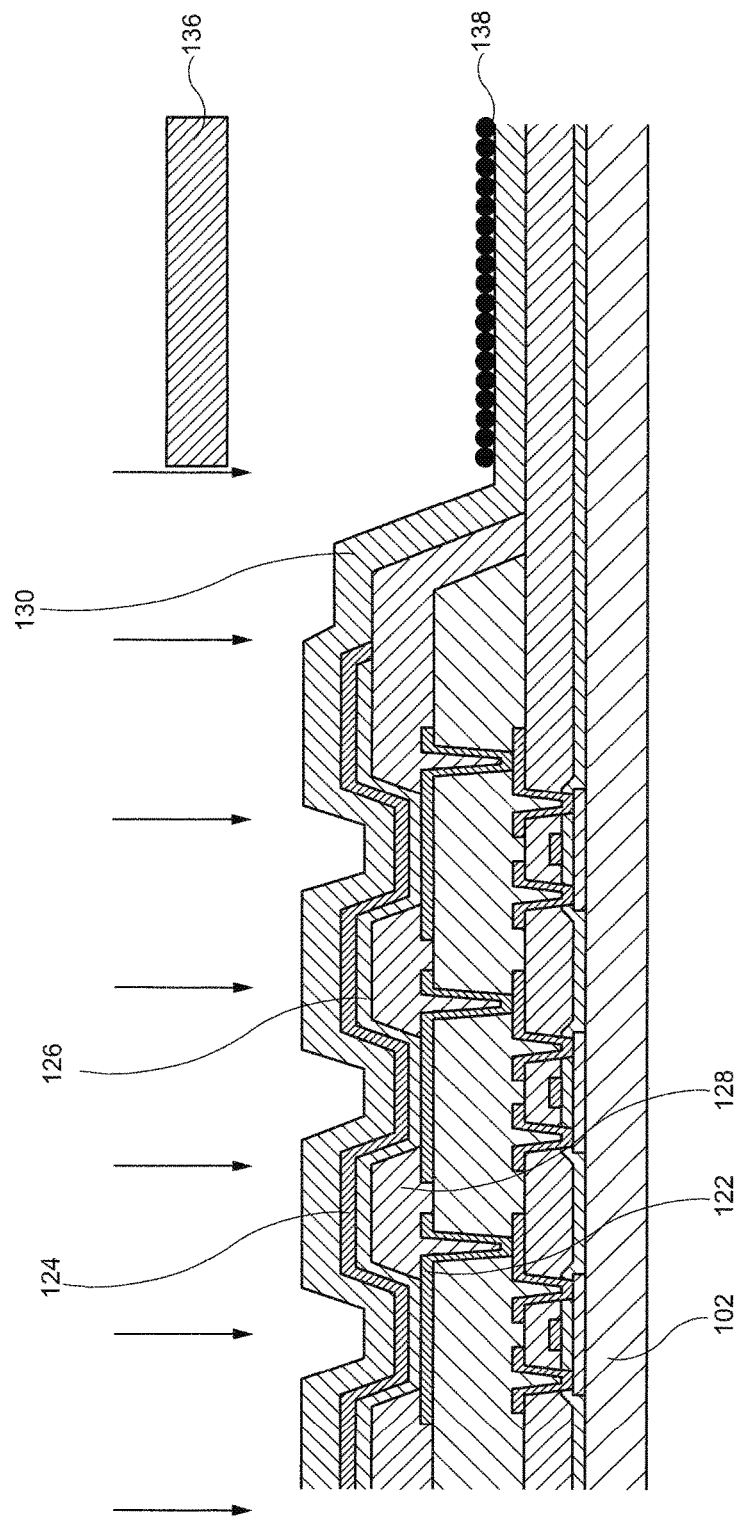
FIG. 4C is a cross-sectional diagram showing a manufacturing method of a display device related to one embodiment of the present invention.

Next, organic molecules 138 in a part above the first insulation film 130 are removed. As is shown in FIG. 4C, a mask 136 is placed on the first insulation film 130 and a pre-treatment for removing the organic molecules 138 through an opening part of the mask 136 is performed. The opening end part of the mask 136 is arranged to be located in the sealing region 113. That is, the opening part of the mask 136 exposes at least the display region 106. For example, the pre-treatment includes performing a glow discharge plasma treatment of a gas including oxygen and removing organic molecules above the first insulation film 130 at the opening part of the mask 136. It is possible to use a plasma treatment, $UV/O_3$, laser and the like as the pre-treatment method. It is possible to use oxygen, argon, nitrogen carbon tetrafluoride or nitrous oxide and the like as the gas used in the plasma treatment. In addition, the plasma treatment may be performed at a normal pressure or at a reduced pressure. By performing a pre-treatment for removing the organic molecules 138 above the first insulation film 130, wettability of the second insulation film 132 material improves and lyophilic properties increase in the first insulation film 130.

Figure 4D:
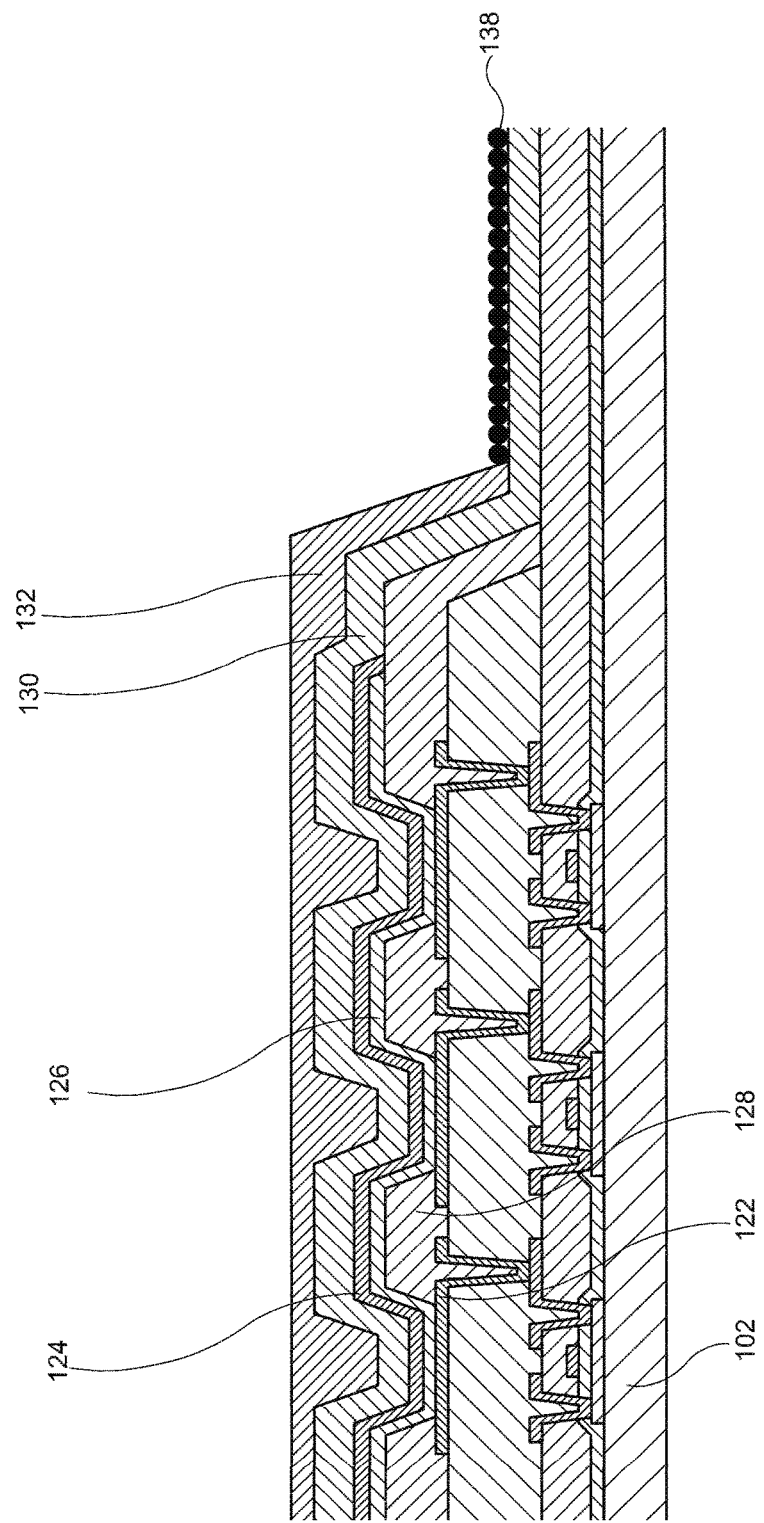
FIG. 4D is a cross-sectional diagram showing a manufacturing method of a display device related to one embodiment of the present invention.

Next, the second insulation film 132 is formed above the first insulation film 130. In the present embodiment, an acrylic resin film is formed using an inkjet method. A region from which organic molecules are removed which is the opening part of the mask 136 in FIG. 4C has improved wettability and higher lyophilic properties. On the other hand, a region in which organic molecules remain protected by the mask 136 still has poor wettability and liquid repellency increases. As a result, as is shown in FIG. 4D, the second insulation film 132 is repelled in a region where organic molecules remain and is selectively formed in a region where organic molecules are removed. By utilizing the properties of organic molecules in this way, it is possible to control the film formation location of the second insulation film 132. As is shown in FIG. 2, a region in which the second insulation film 132 is formed is smaller than a region in which the first insulation film 130 is formed and also includes the display region 106. As is shown in FIG. 3, an end part of a region in which the second insulation film 132 is formed is within a region in which the first insulation film 130 is formed and is located within the sealing region 113.

Figure 4E:
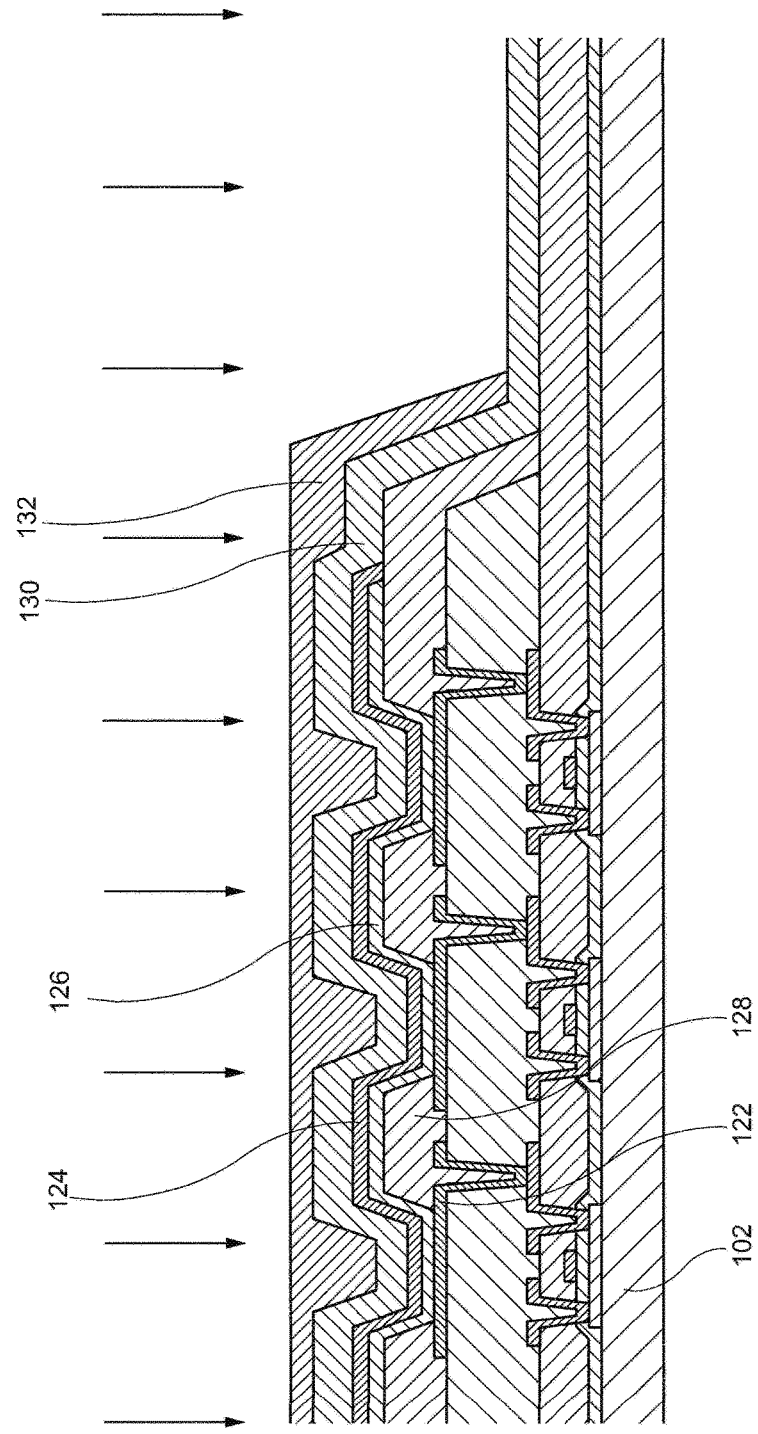
FIG. 4E is a cross-sectional diagram showing a manufacturing method of a display device related to one embodiment of the present invention.

Next, the remaining organic molecules 138 above the first insulation film 130 are removed. As is shown in FIG. 4E, a process is performed for removing the organic molecules 138 of the first insulation film 130. For example, remaining organic molecules above the first insulation film 130 are removed by performing a glow discharge plasma treatment of a gas including oxygen on a film formation region. However, the present embodiment is not limited thereto and it is possible to use various methods in a process for removing the organic molecules 138 above the first insulation film 130. By performing a process for removing the organic molecules 138 above the first insulation film 130, adhesion of the third insulation film 134 material increases on the first insulation film 130 and the effect of being able to prevent water transportation due to the existence of organic materials at the interface of the first insulation film 130 and third insulation film 134 is obtained. In addition, it is possible to treat not the entire film formation region but only above the first insulation film 130 where organic molecules remain, or only a part above the first insulation film 130. In the case where only a part above the first insulation film 130 is treated, at least a region enclosing an end part of the second insulation film 132 is treated.

Figure 4F:
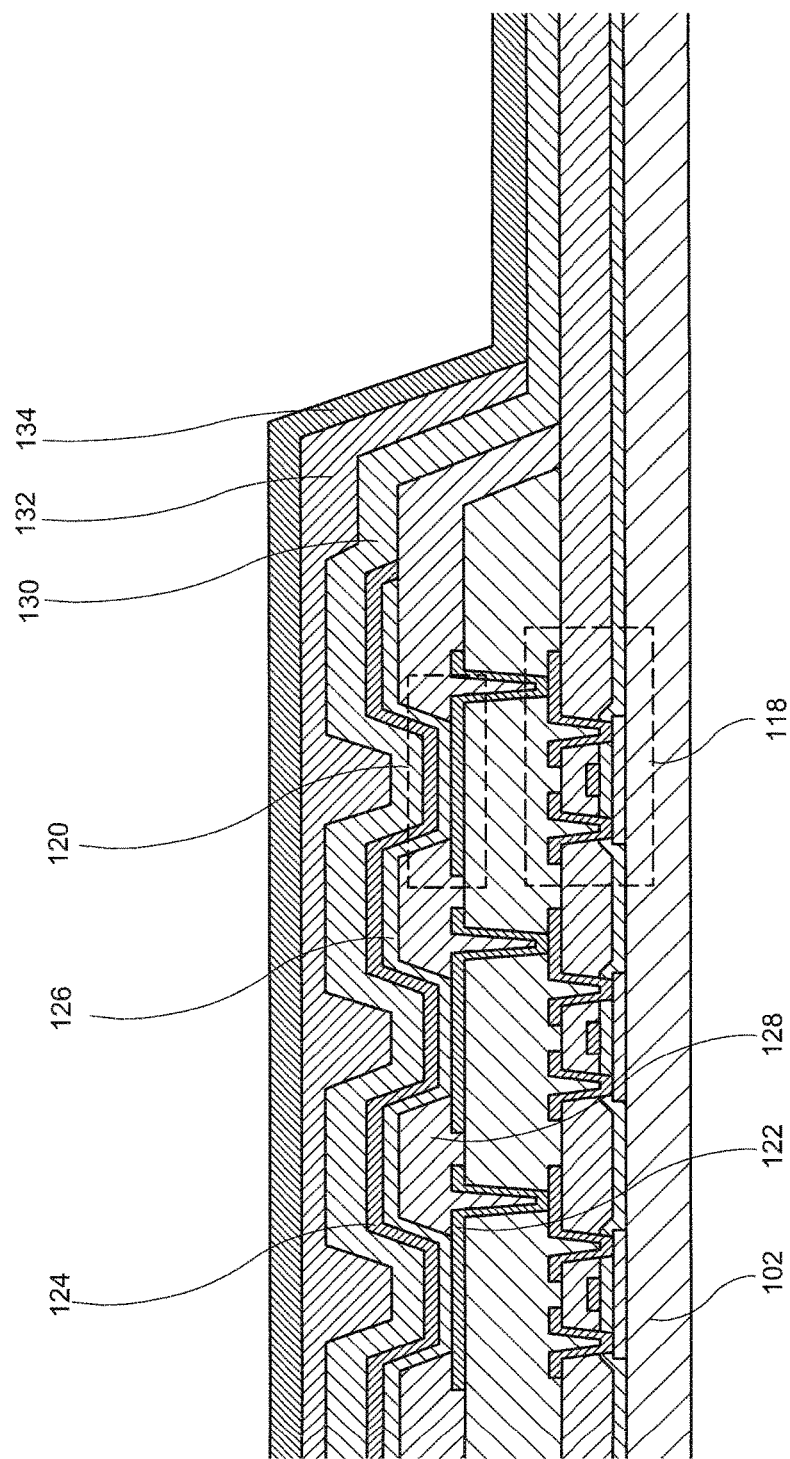
FIG. 4F is a cross-sectional diagram showing a manufacturing method of a display device related to one embodiment of the present invention.

Next, the third insulation film 134 is formed above the first insulation film 130 and second insulation film 132. In the present embodiment, a silicon nitride film is formed using a plasma CVD method. In FIG. 4E, adhesion of the third insulation film 134 increases in a region where organic molecules are removed. As a result, as is shown in FIG. 4F, the third insulation film 134 is formed above the first insulation film 130 and second insulation film 132. Furthermore, the third insulation film 134 has a structure covering an end part of the second insulation film 132. By utilizing the properties of organic molecules in this way, it is possible to selectively form the second insulation film 132 at an intended location. As is shown in FIG. 2 and FIG. 3, although the third insulation film 134 is formed on approximately the entire surface of the first substrate 102 formed with circuits the same as the first insulation film 130, the present embodiment is not limited thereto. A region where the third insulation film 134 is formed is larger than a region where the second insulation film 132 is formed, and an end part of a region where the third insulation film 134 is formed may be located further to the outer side than an end part of a region where the second insulation film 132 is formed.

According to the film formation method related to the present invention, in order to determine the location of an end part of the second insulation film 132, first, organic molecules are adsorbed to the first insulation film 130 and next organic molecules in a film formation region are removed as is shown in FIG. 4B and FIG. 4C. In other words, organic molecules are selectively adsorbed to a non-film formation region of the first insulation film 130. By adsorbing organic molecules to the first insulation film 130, wettability of that region with respect to the second insulation film material is poor and liquid repellency increases. A region where organic molecules are removed has improved wettability with respect to the second insulation material and lyophilic properties increase. As a result, as is shown in FIG. 4D, the second insulation film 132 is repelled in a region where organic molecules remain and is selectively formed in a region where organic molecules are removed. By utilizing the properties of organic molecules in this way, it is possible to control the film formation range of the second insulation film 132.

It is possible to prevent an end part of the second insulation film 132 from being exposed from a sealing film using the manufacturing method of a display device which uses the film formation method related to the present embodiment. In this way, it is possible to suppress infiltration of water from an end part of an insulation film and provide a display device with high reliability. In addition, since it is possible to control the location of a sealing film stacked in three layers, it is possible to narrowly design the sealing region 113 and make the outer periphery part of the display device narrower.

Second Embodiment

Since the structure of the display device 100 and a part of the manufacturing process is common with the first embodiment, an overlapping explanation is omitted from the present embodiment.
<Manufacturing Method>
In the film formation method related to the first embodiment, organic molecules are adsorbed to approximately the entire surface of the first insulation film 130, next the organic molecules in a film formation region of the second insulation film 132 above the first insulation film 130 are removed and the second insulation film 132 is formed. In the film formation method related to the second embodiment, organic molecules are adsorbed to a non-film formation region of the second insulation film 132 above the first insulation film 130 and the second insulation film 132 is formed. Furthermore, a detailed explanation of parts which are the same as in the first embodiment is omitted.

A manufacturing method of the display device 100 in the present embodiment is explained while referring to FIG. 5A to FIG. 5E. In the present embodiment, since it is possible to use an existing method apart from the formation of an insulation film, such explanation is omitted, and a method for forming layers above the common pixel electrode 124 in the display region 106 and sealing region 113 is explained in the diagram.

Figure 5A:
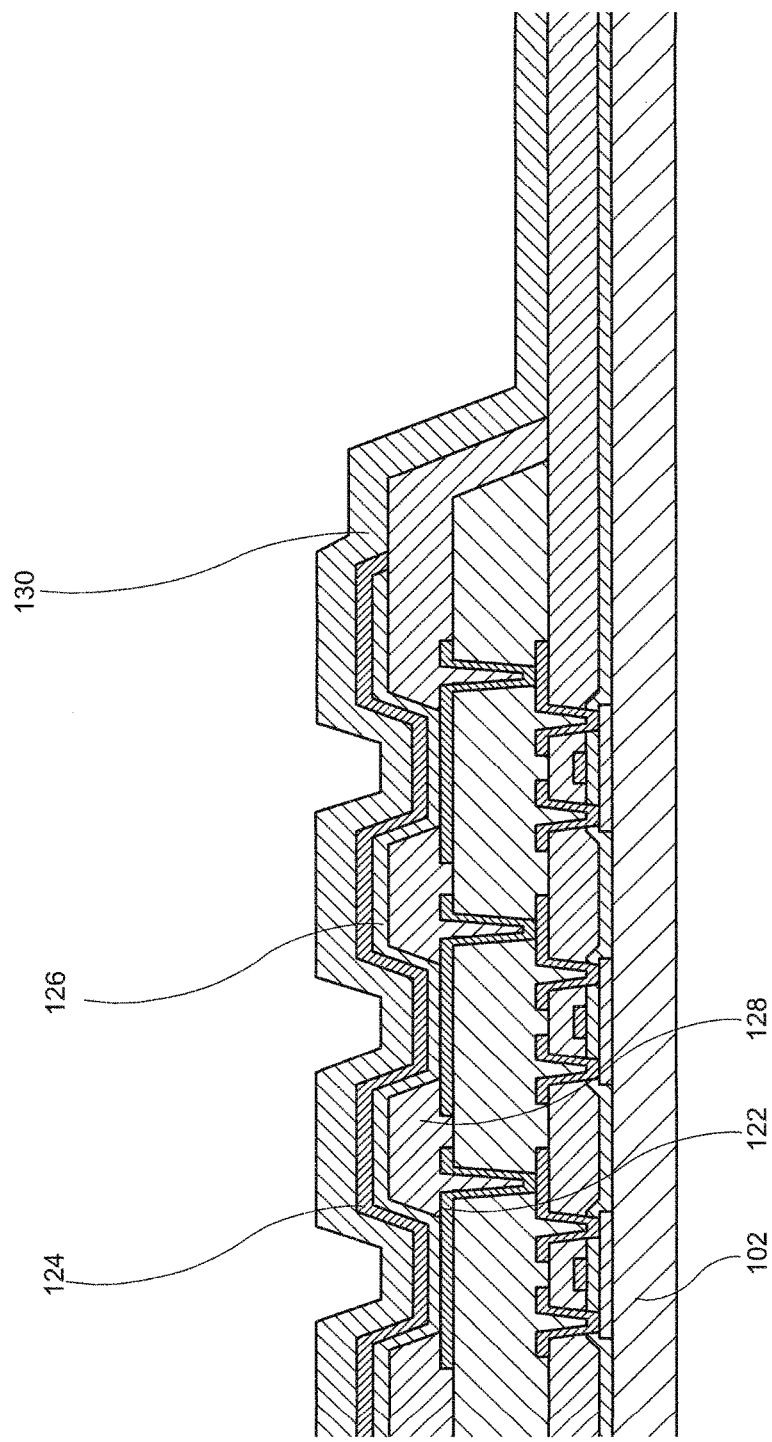
FIG. 5A is a cross-sectional diagram showing a manufacturing method of a display device related to one embodiment of the present invention.

First, the first insulation film 130 is formed. As is shown in FIG. 5A, the first insulation film 130 is formed above a film formation region of the first substrate 102 formed with circuits. In the present embodiment, a silicon nitride film is formed using a plasma CVD method. As is shown in FIG. 2 and FIG. 3, although the first insulation film 130 in the present embodiment is formed on approximately the entire surface of the first substrate 102 formed with circuits, the present embodiment is not limited thereto. The first insulation film 130 is formed to include at least the display region 106 and a part of sealing region 113.

Figure 5B:
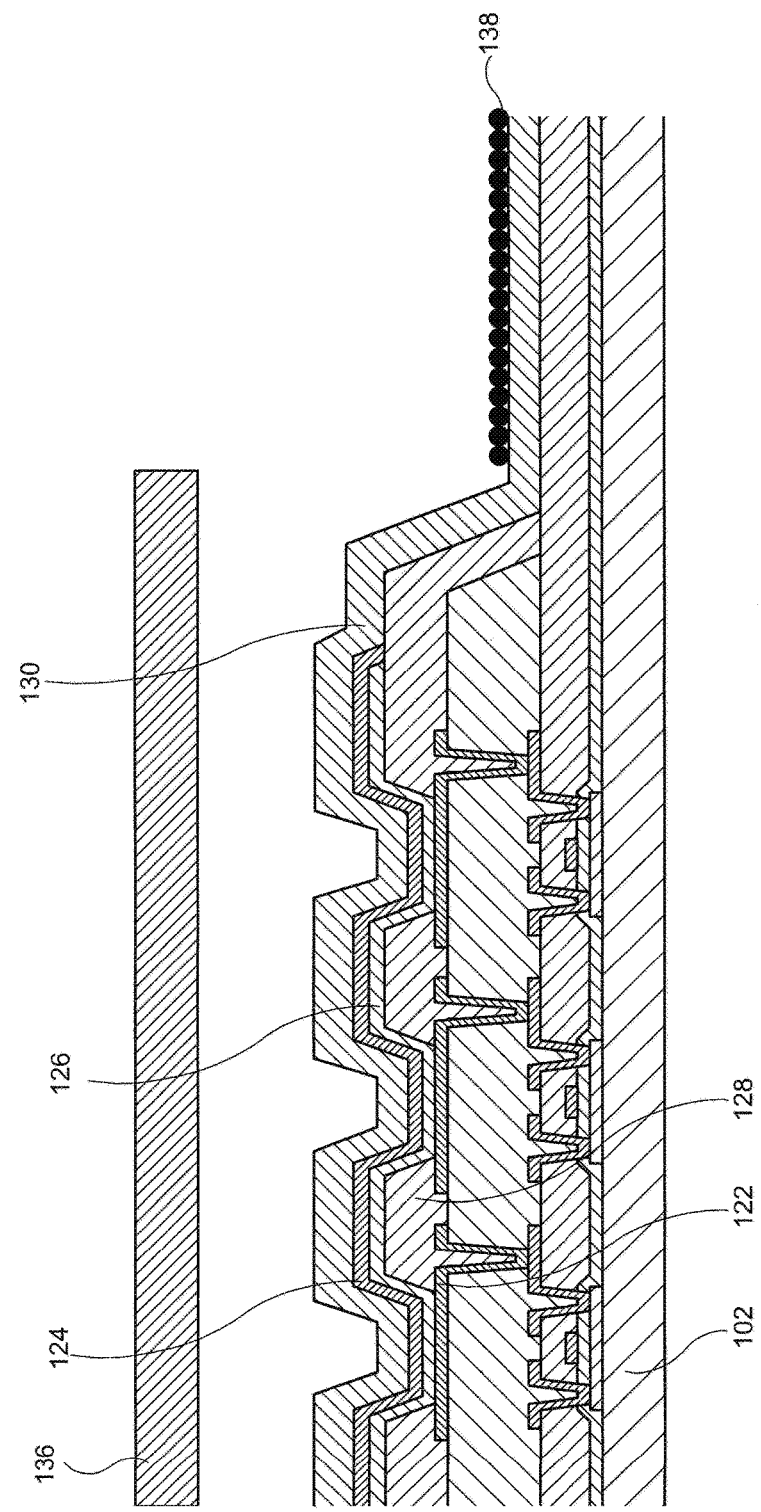
FIG. 5B is a cross-sectional diagram showing a manufacturing method of a display device related to one embodiment of the present invention.

Next, organic molecules 138 are adsorbed to a part of the first insulation film 130. As is shown in FIG. 5B, the mask 136 is arranged on the first insulation film 130, exposed to organic vapor through an opening part of the mask 136 and organic molecules 138 are adsorbed. An end part of the mask 136 is arranged to be located in the sealing region 113. That is, the mask 136 masks at least the display region 106. Since an opening part of the mask has a shape which encloses the display region 106, if it is difficult to hold the mask, the organic molecules 138 may be adsorbed a plurality of times using a plurality of masks. For example, the opening part which encloses the display region 106 may be divided in two and the organic molecules 138 may be separately adsorbed twice. At this time, both of the masks mask at least the display region 106. A part of each of the opening parts may also overlap. It is possible to use organic molecules such as phthalic ester, low molecular siloxane, phosphoric acid ester or dibutylhydroxytoluene and the like as the material of the organic molecules. However, the present embodiment is not limited thereto and a material which has high adhesion with respect to the first insulation film 130, high liquid repellency with respect to the second insulation film 132 and which can be easily removed is preferred as the organic molecules 138. By adsorbing the organic molecules 138 to the surface of the first insulation film 130, wettability of the second insulation film 132 material becomes poor and liquid repellency increases in the first insulation film 130.

Figure 5C:
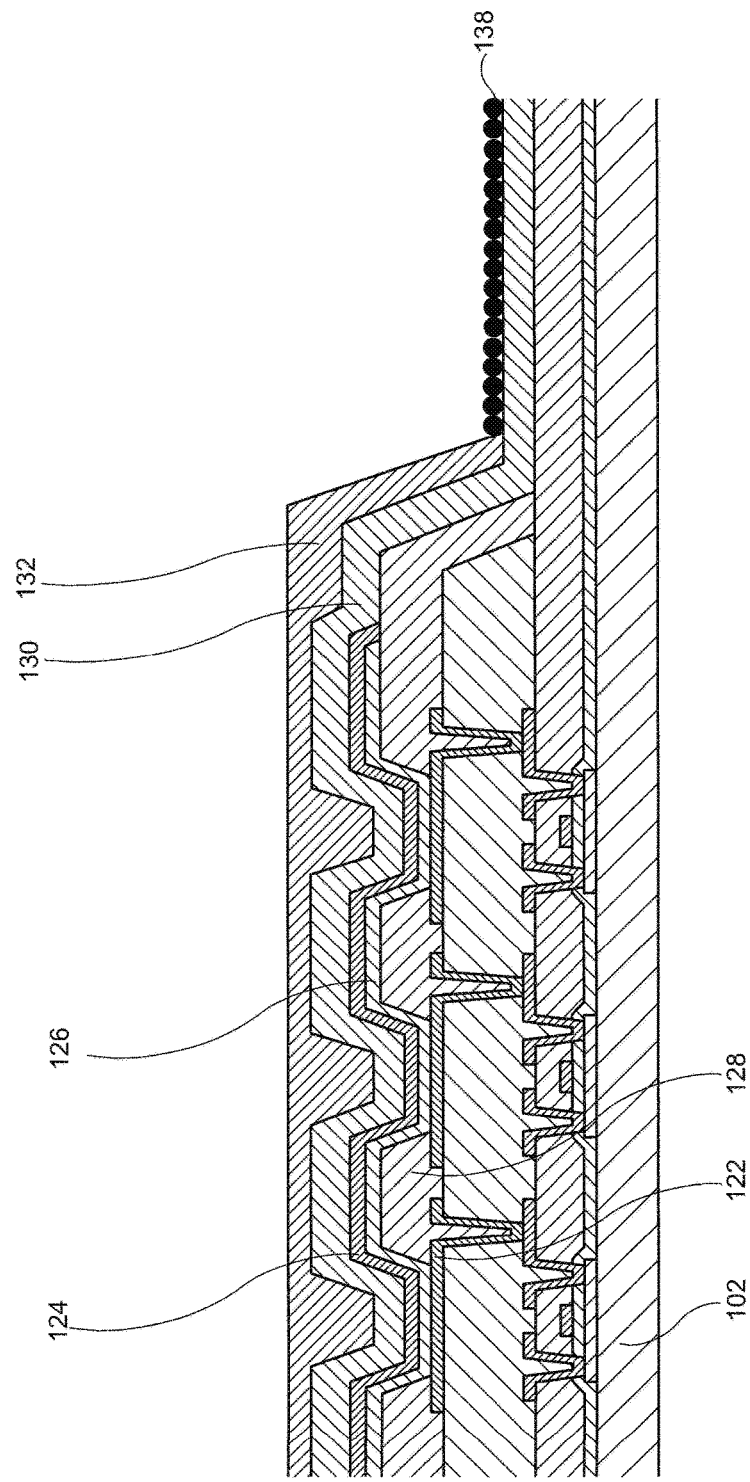
FIG. 5C is a cross-sectional diagram showing a manufacturing method of a display device related to one embodiment of the present invention.

Next, the second insulation film 132 is formed above the first insulation film 130. In the present embodiment, an acrylic resin film is formed using an inkjet method. In FIG. 5B, wettability becomes poor and liquid repellency increases in a region where organic molecules are adsorbed at an opening part of the mask 136. On the other hand, wettability does not change and there are lyophilic properties in a region where organic molecules are unadsorbed where the mask 136 is arranged. As a result, as is shown in FIG. 5C, the second insulation film 132 is repelled in a region where organic molecules are adsorbed and is selectively formed in a region where organic molecules are unadsorbed. By utilizing the properties of organic molecules in this way, it is possible to control the formation location of the second insulation film 132. As is shown in FIG. 2, a region where the second insulation film 132 is formed is smaller than a region where the first insulation film 130 is formed and includes the display region 106. As is shown in FIG. 3, an end part of a region where the second insulation film 132 is formed is within a region where the first insulation film 130 is formed and is located within the sealing region 113.

Figure 5D:
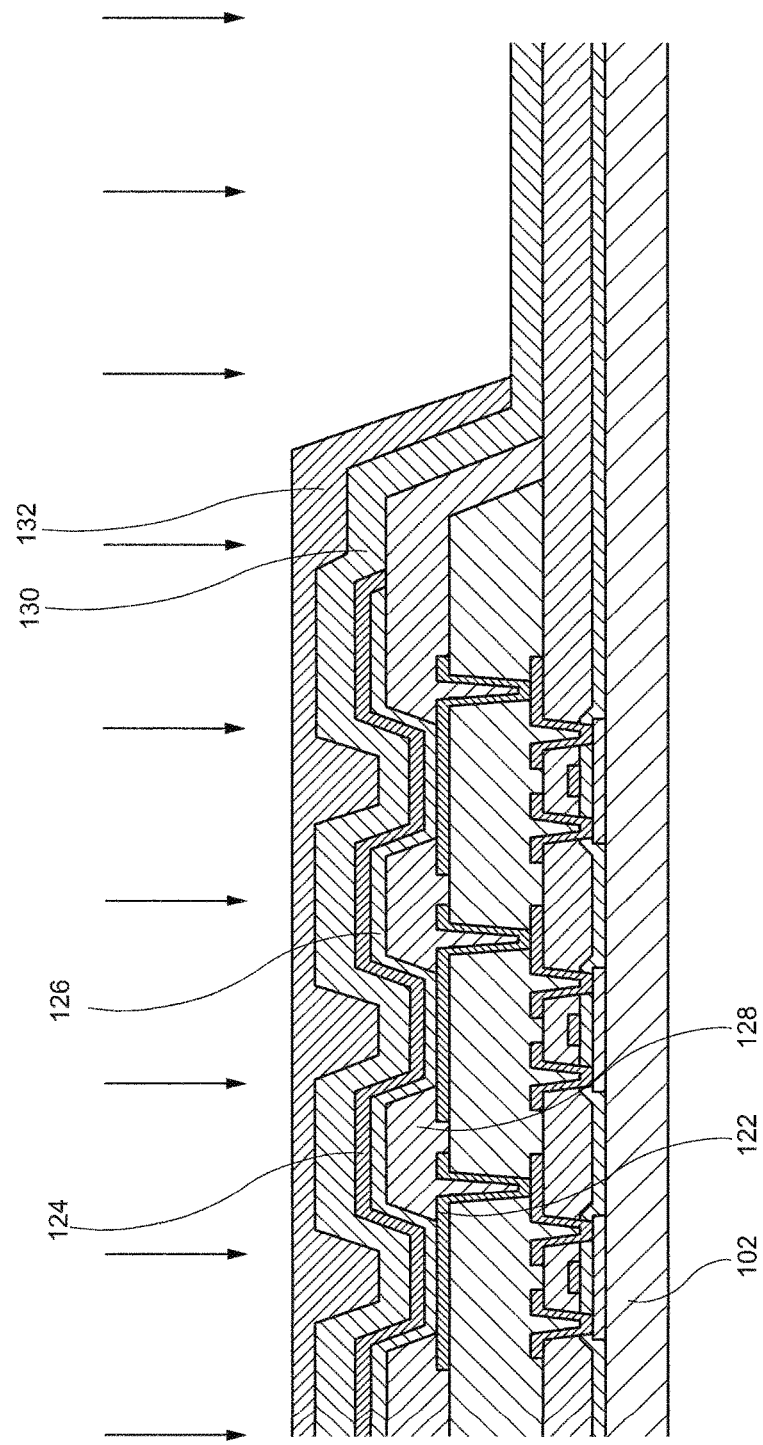
FIG. 5D is a cross-sectional diagram showing a manufacturing method of a display device related to one embodiment of the present invention.

Next, the remaining organic molecules 138 above the first insulation film 130 are removed. As is shown in FIG. 5D, a treatment for removing the organic molecules 138 of the first insulation film 130 is performed. For example, a glow discharge plasma treatment of a gas including oxygen is performed on a film formation region and organic molecules above the first insulation film 130 are removed. However, the present embodiment is not limited to thereto and it is possible to use a plasma treatment, UV/O$_2$, laser and the like as the pre-treatment method. It is possible to use oxygen, argon, nitrogen, carbon tetrafluoride or nitrous oxide and the like as the gas used in the plasma treatment. In addition, the plasma treatment may be performed at a normal pressure or at a reduced pressure. By performing a treatment for removing the organic molecules 138 above the first insulation film 130, adhesion of the third insulation film 134 material increases in the first insulation film 130 and the effect of being able to prevent water transportation due to the existence of organic materials at the interface of the first insulation film 130 and third insulation film 134 is obtained. In addition, it is possible to treat not the entire film formation region but only above the first insulation film 130 where organic molecules are adsorbed, or only a part above the first insulation film 130. In the case where only a part above the first insulation film 130 is treated, at least a region enclosing an end part of the second insulation film 132 is treated.

Figure 5E:
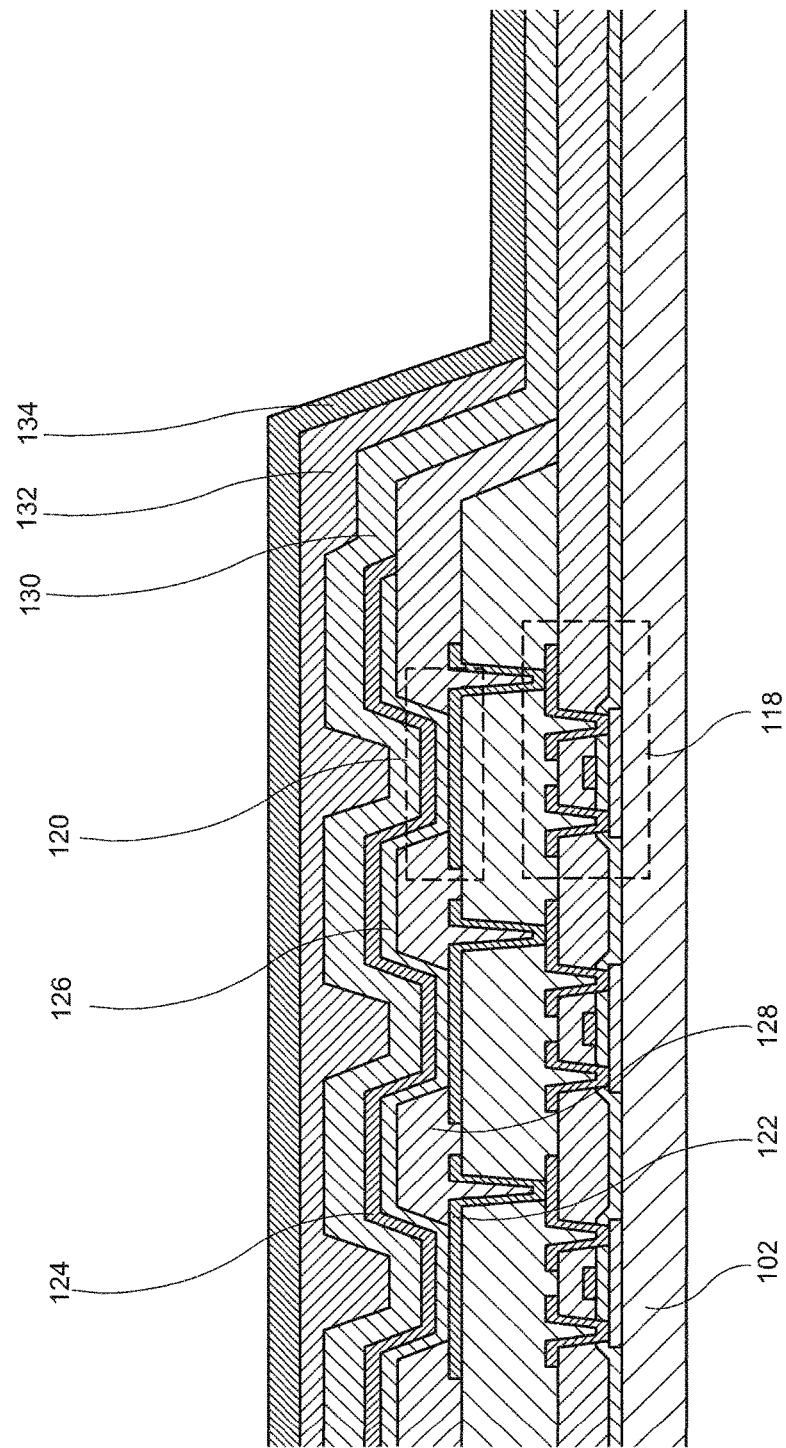
FIG. 5E is a cross-sectional diagram showing a manufacturing method of a display device related to one embodiment of the present invention.

Next, the third insulation film 134 is formed above the first insulation film 130 and second insulation film 132. In the present embodiment, a silicon nitride film is formed using a plasma CVD method. In FIG. 5D, adhesion of the third insulation film 134 increases in a region where organic molecules are removed. As a result, as is shown in FIG. 5E, the third insulation film 134 is formed above the first insulation film 130 and second insulation film 132. Furthermore, the third insulation film 134 has a structure covering an end part of the second insulation film 132. By utilizing the properties of organic molecules in this way, it is possible to selectively form the second insulation film 132 at an intended location. As is shown in FIG. 2 and FIG. 3, although the third insulation film 134 is formed on approximately the entire surface of the first substrate 102 formed with circuits the same as the first insulation film 130, the present embodiment is not limited thereto. A region where the third insulation film 134 is formed is larger than a region where the second insulation film 132 is formed, and an end part of a region where the third insulation film 134 is formed may be located further to the outer side than an end part of a region where the second insulation film 132 is formed.

According to the film formation method related to the present invention, in order to determine the location of an end part of the second insulation film 132, organic molecules are selectively adsorbed to a non-film formation region of the first insulation film 130. By adsorbing organic molecules to the first insulation film 130, wettability of that region is poor and liquid repellency increases. Wettability dos not change and there are lyophilic properties in a region where organic molecules are unadsorbed. As a result, as is shown in FIG. 5C, the second insulation film 132 is repelled in a region where organic molecules are adsorbed and is selectively formed in a region where organic molecules are unadsorbed. By utilizing the properties of organic molecules in this way, it is possible to control the film formation position of the second insulation film 132.

It is possible to prevent an end part of the second insulation film 132 from being exposed from a sealing film using the manufacturing method of a display device which uses the film formation method related to the present embodiment. In this way, it is possible to suppress infiltration of water from an end part of an insulation film and provide a display device with high reliability. In addition, since it is possible to control the position of a sealing film stacked in three layers, it is possible to narrowly design the sealing region 113 and make the outer periphery part of the display device narrower.

Third Embodiment

Since the structure of a part of the display device 100 and a part of the manufacturing process is common with the first embodiment, an overlapping explanation is omitted from the present embodiment.

Figure 6:
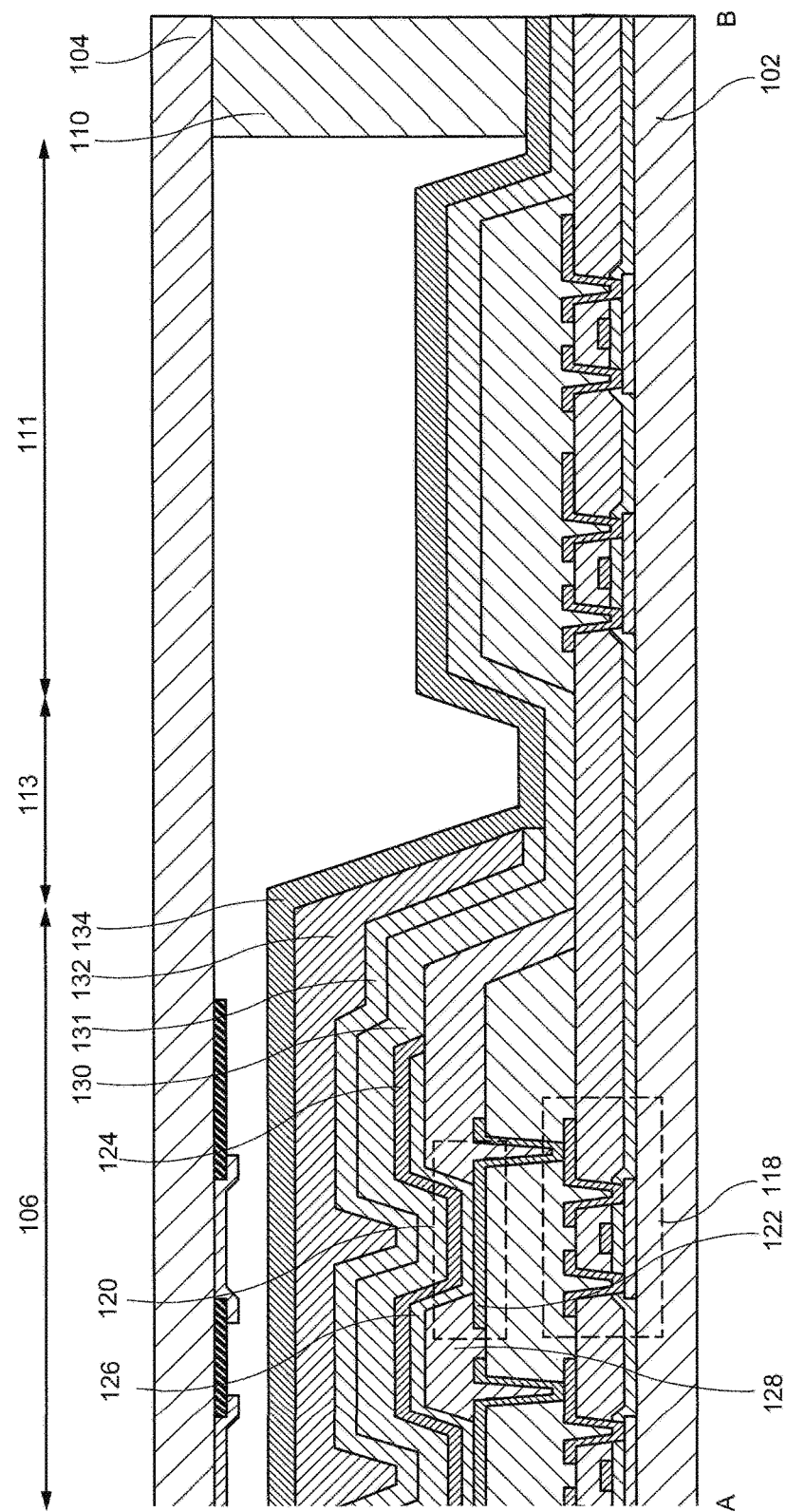
FIG. 6 is a cross-sectional diagram showing an approximate structure of a display device manufactured using a manufacturing method related to one embodiment of the present invention.

An approximate structure of the display device 100 related to the present embodiment is explained while referring to FIG. 6. FIG. 6 is a cross-sectional diagram showing an approximate structure of the display device 100 manufactured using the manufacturing method related to the present embodiment. FIG. 6 shows a cross-sectional view along the line A-B in FIG. 2. Since the structure of the display device 100 related to the third embodiment is similar to the first embodiment apart from the structure of a sealing film, an explanation of an overlapping structure is omitted and points of difference are mainly explained.

A sealing film is arranged in an upper part of the common pixel electrode 124. For example, in an organic EL display device which uses an organic EL element as the light emitting element 120, since an organic EL layer is extremely weak to water, when water infiltrates from the exterior to the interior of a panel and reaches the organic EL layer, non-lighting regions called dark spots may be produced. Thus, a sealing film to cover the display region 106 is arranged. It is preferred that an insulation film which can block the infiltration of water is used for the sealing film, and it is possible to use films of a plurality of layers of an inorganic insulation material and an organic insulation material. For example, in the case where an inorganic insulation material is used, it is possible to use a film such as silicon oxide ($SiO_x$), silicon nitride ($Si_xN_y$), silicon oxynitride ($SiO_xN_y$), silicon nitride oxide ($SiN_xO_y$), aluminum oxide ($Al_xO_y$), aluminum nitride ($Al_xN_y$), aluminum oxynitride ($Al_xO_yN_z$) and aluminum nitride oxide ($Al_xN_yO_z$) and the like (x, y and z are arbitrary). It is possible to use a plasma CVD method or sputtering method as a film formation method.

In addition, it is possible to use a polyimide resin, acrylic resin, epoxy resin, silicone resin, fluororesin and siloxane resin and the like as the organic insulation material covering the inorganic insulation material described above. It is possible to use an inkjet method for example as the film formation method. An adhesion film 131 is formed at a location for forming an inorganic insulation film in the present embodiment in order to control the film formation location of an organic insulation film. It is possible to use inorganic molecules such as silicon oxide or amorphous silicon and the like as the material of the adhesion film 131. By forming the adhesion film 131 above an inorganic insulation film described above, wettability of an organic insulation material improves and it is possible to form a region where an organic insulation film is formed and a region where an organic insulation film is not formed.

Furthermore, it is possible to use a structure in which an inorganic insulation layer is stacked above the organic insulation layer described above. By adopting a stacked structure of an organic insulation layer and inorganic insulation layer, it is possible to expect further prevention of water infiltration. In the case of a stacked structure, it is desirable that an end part of the organic insulation layer is covered by the inorganic insulation layer.

In the present embodiment, the sealing film has a three-layer structure in which a first insulation film 130, second insulation film 132 and third insulation film 134 are arranged in this order from the bottom layer side. The adhesion film 131 is arranged between the first insulation film 130 and second insulation film 132. The four layers of the first insulation film 130, adhesion film 131, second insulation film 132 and third insulation film 134 are all arranged so as to cover the display region 106. That is, an end part of the first insulation film 130, adhesion film 131, second insulation film 132 and third insulation film 134 is arranged on the outer side of an end part of the display region 106.

It is possible to use an inorganic insulation material or an organic insulation material as the first insulation film 130. It is preferred that a film with high water blocking properties is used as the first insulation film 130 and use of an inorganic insulation layer is particularly preferred. For example, a silicon nitride film can be used. At this time, a single layer of just the first insulation film 130 may not be sufficiently be used as a cover film due to concave and convex parts caused by the light emitting element 120 and the like within the display region 106 and a water transport path is sometimes produced.

Thus, the second insulation film 132 is arranged as a second layer in order to secure high flattening properties. It is possible to use an organic insulation material such as acrylic and the like as the second insulation film 132. As is shown in FIG. 6, although a region of the second insulation film 132 is included in the display region 106, the first drive circuit 111 is not included. That is, an end part of the second insulation film 132 is located within the sealing region 113 between the display region 106 and first drive circuit 111. In the present embodiment, the adhesion film 131 is formed in advance at a location for forming the second insulation film 132. That is, an end part of the adhesion film 131 is located within the sealing region 113 between the display region 106 and first drive circuit 111. It is possible to use inorganic molecules such as silicon oxide or amorphous silicon and the like as the material of the adhesion film 131. By forming the adhesion film 131 above the first insulation film 130, wettability of an organic insulation material in a region where the adhesion film 131 is formed improves and it is possible to form a region where the second insulation film 132 is formed and a region where the second insulation film 132 is not formed.

The third insulation film 134 is arranged above the second insulation film 132 with improved flattening properties. It is possible to provide the third insulation film 134 with high covering properties due to flattening of the second insulation film 132 and suppress the production of a water transport path. It is possible to use an inorganic insulation material or an organic insulation material as the third insulation film 134. The third insulation film 134 is preferred to be a film with particularly high water blocking properties, and the use of an inorganic insulation material such as silicon nitride for example is preferred.

Furthermore, a structure is adopted in the present embodiment in which the first insulation film 130 and third insulation film 134 cover the second insulation film 132 at an end part of the stacked insulation films. As is shown in FIG. 6, the first insulation film 130 and third insulation film 134 are larger than the adhesion film 131 and second insulation film 132 and the first insulation film 130 and third insulation film 134 contact at an outer side of an end part of the adhesion film 131 and the second insulation film 132. By adopting such a structure, an end part of the second insulation film 132 in particular is prevented from being exposed. In the case where an organic insulation layer is used as the second insulation film 132, when the end part thereof is exposed, it is likely to form an infiltration path for water infiltrating from the exterior. There is concern that water infiltrating from an end part of the second insulation film 132 is transported to the light emitting element 120 which decreases the lifetime of the display device 100.

As in the present embodiment, by adopting a structure in which the first insulation film 130 and third insulation film 134 cover the adhesion film 131 and the second insulation film 132 at an end part of the stacked insulation films, it is possible to suppress the infiltration of water from an end part of an insulation film and provide a display device with high reliability. Furthermore, further improvement in resistance to water can be expected from a combination with a sealing structure by a conventional sealing member 110, and it is possible to provide a display device 100 with even higher reliability. In addition, it is possible to narrowly design the sealing region 113 using the structure of stacked insulation films according to the present embodiment and further narrow an outer periphery part of a display device <Manufacturing Method>

In the film formation method related to the first embodiment, organic molecules were adsorbed to approximately the entire surface of the first insulation film 130, next organic molecules in a film formation region of the second insulation film 132 above the first insulation film 130 were removed and the second insulation film 132 was formed. In the film formation method related to the second embodiment, organic molecules were adsorbed to a non-film formation region of the second insulation film 132 above the first insulation film 130, and the second insulation film 132 was formed. In the third embodiment, the adhesion film 131 is formed from silicon oxide or amorphous silicon and the like in a film formation region of the second insulation film 132 above the first insulation film 130, and the second insulation film 132 is formed above the adhesion film 131. At this time, the adhesion film 131 is not formed at the substrate end side, that is, outer side, of an outer part region enclosing the display region. In this way, the second insulation film 132 is not formed in a part of the outer part region in a vicinity of the substrate end.

A manufacturing method of the display device 100 in the present embodiment is explained while referring to FIG. 7A to FIG. 7E. Since it is possible to use the existing methods apart from the formation of an insulation film, such an explanation is omitted in the present embodiment, and a method for forming layers above the common pixel electrode 124 in the display region 106 and sealing region 113 is explained in the diagram.

Figure 7A:
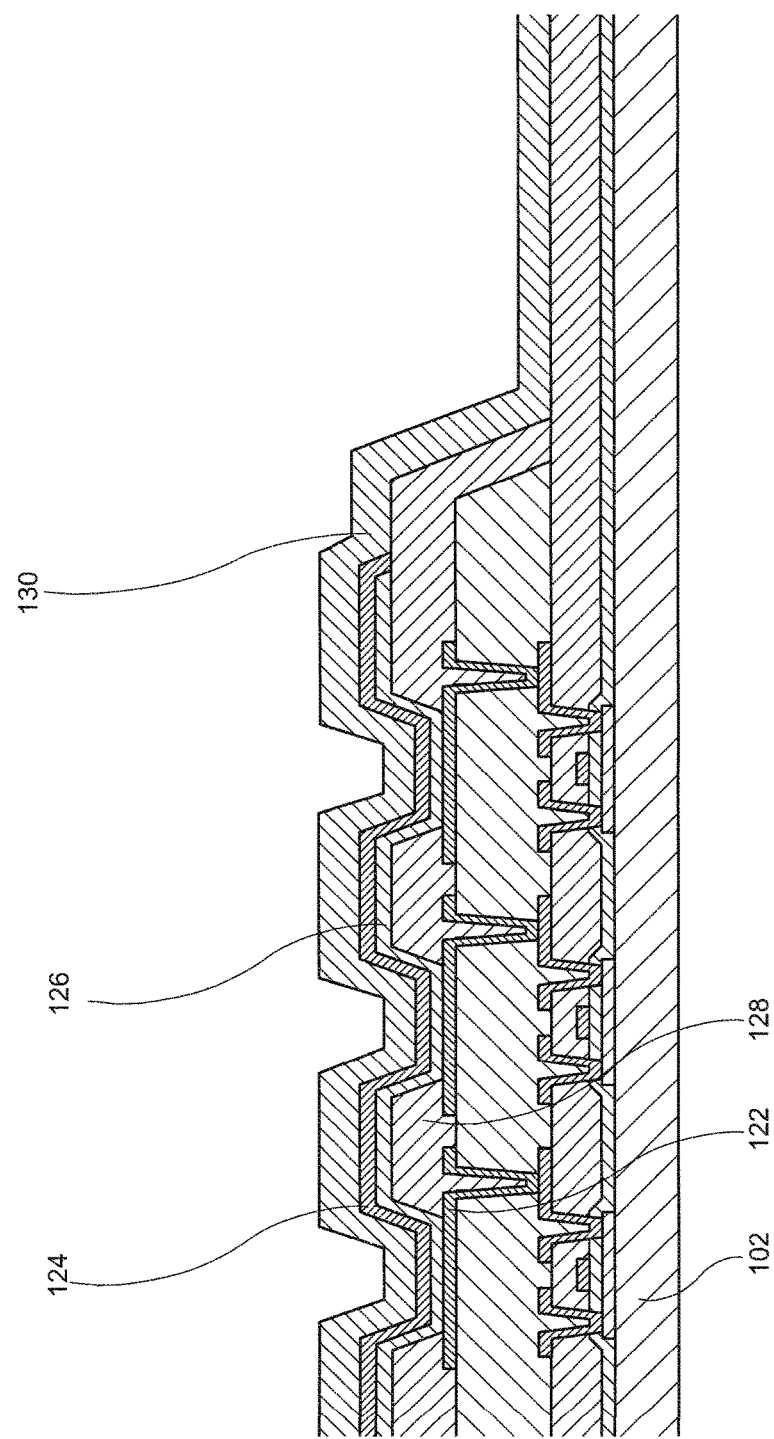
FIG. 7A is a cross-sectional diagram showing a manufacturing method of a display device related to one embodiment of the present invention.

First, the first insulation film 130 is formed. As is shown in FIG. 7A, the first insulation film 130 is formed on a film formation region of the first substrate 102 formed with circuits. In the present embodiment, a silicon nitride film is formed using a plasma CVD method. As is shown in FIG. 7A, although the first insulation film 130 in the present embodiment is formed on approximately the entire surface of the first substrate 102 formed with circuits, the present embodiment is not limited thereto. The first insulation film 130 is formed to include at least the display region 106 and a part of sealing region 113.

Figure 7B:
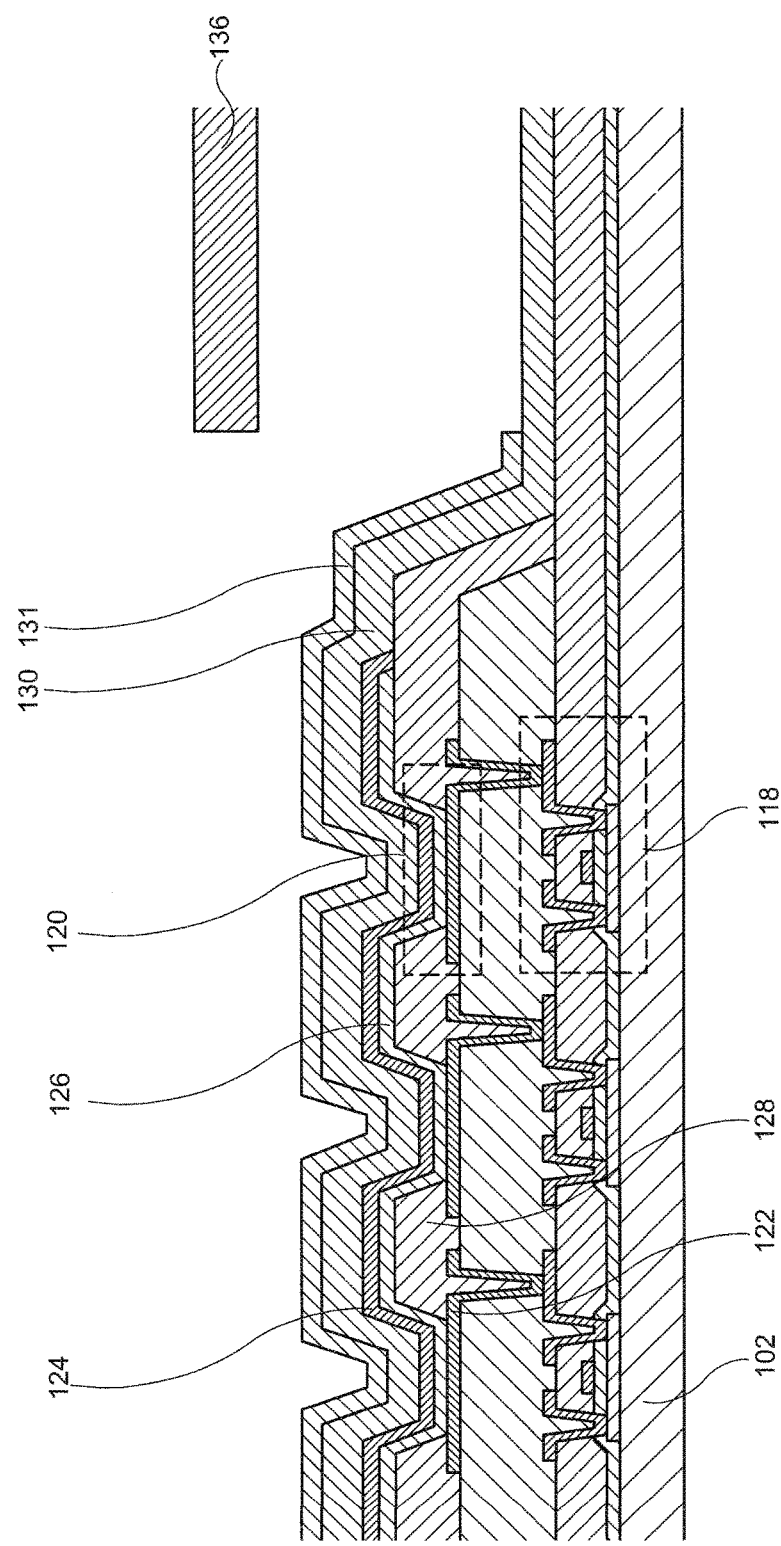
FIG. 7B is a cross-sectional diagram showing a manufacturing method of a display device related to one embodiment of the present invention.

Next, the adhesion film 131 is formed in a part of the first insulation film 130. As is shown in FIG. 7B, a mask 136 is arranged on the first insulation film 130, and the adhesion film 131 is formed through an opening part of the mask 136 by a CVD method using a plasma or a sputtering method using a target or by another method. An opening end part of the mask 136 is arranged to be located in the sealing region 113. That is, the opening part of the mask 136 exposes at least the display region 106. It is possible to use inorganic molecules such as silicon oxide or amorphous silicon as the material of the adhesion film 131. However, the present embodiment is not limited thereto and a material which has high adsorption to the first insulation film 130 and high adhesion to the second insulation film 132 is preferred as the adhesion film 131. By forming the adhesion film 131 on the surface of the first insulation film 130, wettability of the second insulation film 132 material improves in a region where the adhesion film 131 is formed, and it is possible to form a region where the second insulation film 132 is formed and a region where the second insulation film 132 is not formed.

Figure 7C:
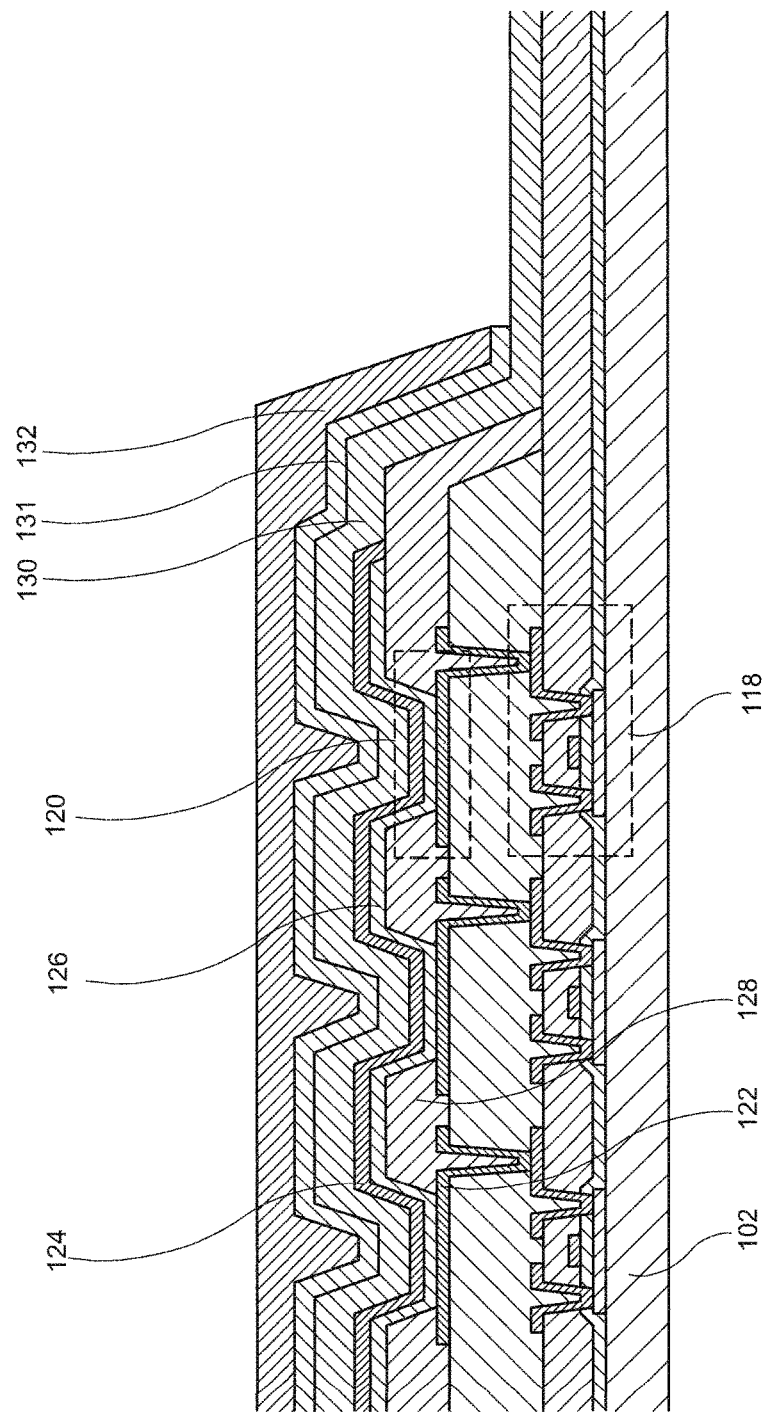
FIG. 7C is a cross-sectional diagram showing a manufacturing method of a display device related to one embodiment of the present invention.

Next, the second insulation film 132 is formed above the adhesion film 131. In the present embodiment, an acrylic resin film is formed using an inkjet method. A region where the adhesion film 131 is formed which is the opening part of the mask 136 in FIG. 7B has improved wettability and higher lyophilic properties. On the other hand, wettability of a region which is covered by the mask 136 does not change and liquid repellency becomes relatively high. As a result, as is shown in FIG. 7C, the second insulation film 132 is selectively formed in a region formed with the adhesion film 131. By utilizing the properties of an adhesion film in this way, it is possible to control the film formation location of the second insulation film 132. As is shown in FIG. 6, a region where the adhesion film 131 and second insulation film 132 are formed is smaller than a region where the first insulation film 130 is formed and includes the display region 106. As is shown in FIG. 6, an end part of a region where the adhesion film 131 and second insulation film 132 are formed is within a region where the first insulation film 130 is formed and is located within the sealing region 113.

Next a glow discharge plasma treatment of a gas including nitrous oxide may be performed above the first insulation film 130 and the second insulation film 132. By performing a glow discharge plasma treatment, water repellent materials such as organic molecules are removed from above the first insulation film 130 and the second insulation film 132. However, the present embodiment is not limited thereto and it is possible to use various methods for removing organic molecules and the like from above the first insulation film 130 and the second insulation film 132. By performing a treatment for removing organic molecules and the like from above the first insulation film 130 and the second insulation film 132, adhesion of the third insulation film 134 material increases on the insulation film 130 and the second insulation film 132. In addition, it is possible to treat not the entire film formation region but only above the first insulation film 130 or only a part above the first insulation film 130. In the case where only a part above the first insulation film 130 is treated, at least a region enclosing an end part of the second insulation film 132 is treated.

Figure 7E:
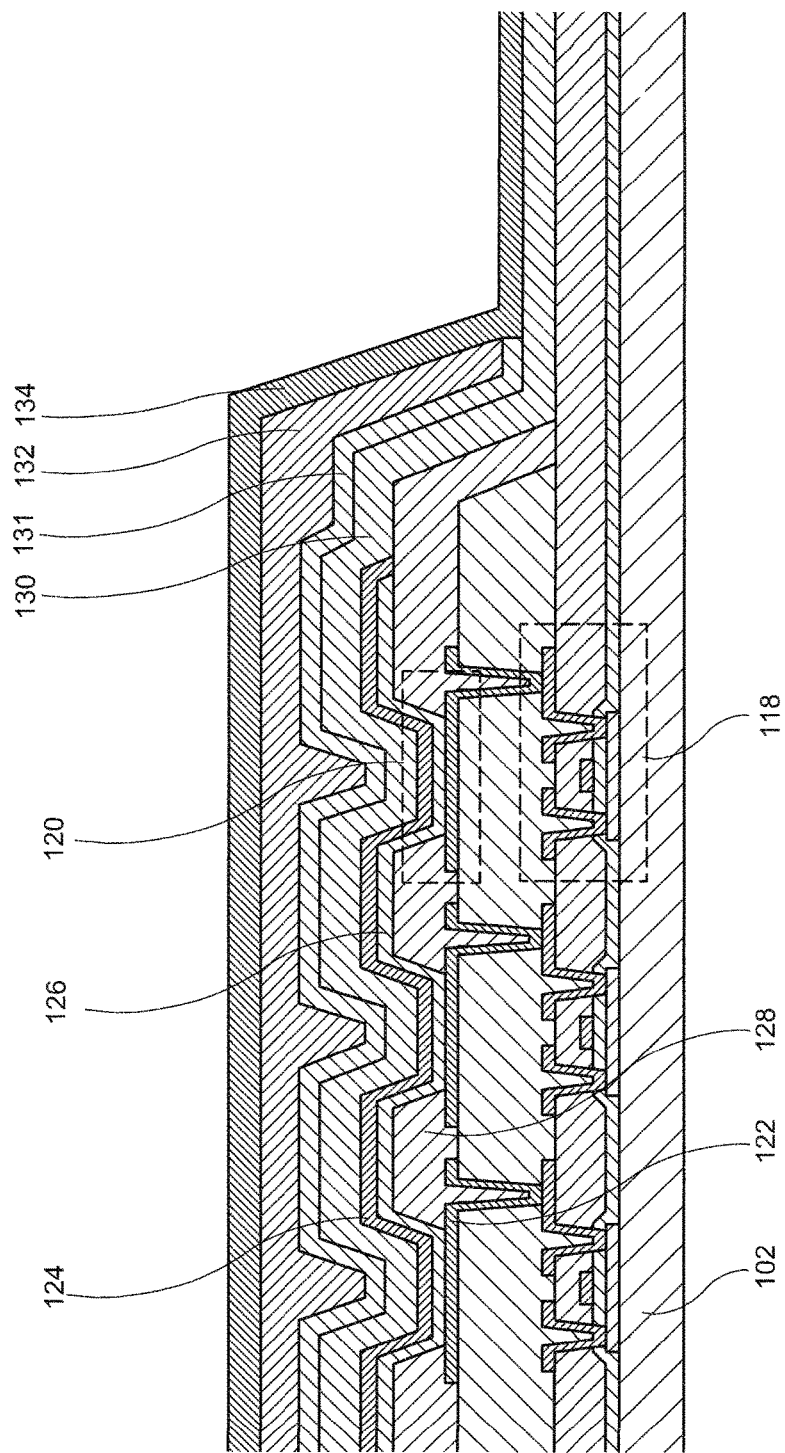
FIG. 7E is a cross-sectional diagram showing a manufacturing method of a display device related to one embodiment of the present invention.

Next, the third insulation film 134 is formed above the first insulation film 130 and the second insulation film 132. A silicon oxide film is formed using a plasma CVD method in the present embodiment. Adhesion of the third insulation film 134 in a region from which organic molecules and the like are removed in FIG. 7D increases. As a result, the third insulation film 134 is formed above the first insulation film 130 and the second insulation film 132 as is shown in FIG. 7E. Furthermore, the third insulation film 134 has a structure covering an end part of the adhesion film 131 and the second insulation film 132. By utilizing the properties of the adhesion film 131 in the way, it is possible to selectively form the second insulation film 132 at an intended location. As is shown in FIG. 6, although the third insulation film 134 is formed on approximately the entire surface of the first substrate 102 formed with circuits the same as the first insulation film 130, the present embodiment is not limited thereto. A region where the third insulation film 134 is formed is larger than a region where the adhesion film 131 and second insulation film 132 are formed, and an end part of a region where the third insulation film 134 is formed may be located further to the outer side than an end part of a region where the adhesion film 131 and second insulation film 132 are formed.

According to the film formation method related to the present invention, in order to determine the location of an end part of the second insulation film 132, as is shown in FIG. 7B, the adhesion film 131 is selectively formed in a film formation region of the second insulation film 132 above the first insulation film 130. By forming the adhesion film 131 above the first insulation film 130, wettability of the region formed with the adhesion film 131 improves with respect to the second insulation film material and lyophilic properties increase. As a result, as is shown in FIG. 7C, the second insulation film 132 is selectively formed in a region where the adhesion film 131 is formed. By utilizing the properties of the adhesion film 131 in this way, it is possible to control the film formation range of the second insulation film 132.

It is possible to prevent an end part of the adhesion film 131 and second insulation film 132 from being exposed from a sealing film using the manufacturing method of a display device which uses the film formation method related to the present embodiment. In this way, it is possible to suppress infiltration of water from an end part of an insulation film and provide a display device with high reliability. In addition, since it is possible to control the location of a sealing film stacked in three layers, it is possible to narrowly design the sealing region 113 and make the outer periphery part of the display device narrower.

The display device 100 and a manufacturing method thereof related to the preferred embodiments of the present invention were explained above. However, these are merely examples and the technical scope of the present invention is not limited to these embodiments. Actually, a person ordinarily skilled in the art can perform various modifications without departing from the concept of the present invention claimed within the scope of the patent claims. Therefore, such modifications are naturally also to be interpreted as belonging to the technical scope of the present invention.

What is claimed is:

1. A manufacturing method of a display device, the method comprising:
    forming a first insulation film above a region including a display region of a substrate having the display region arranged with a plurality of display elements;
    adsorbing organic molecules to approximately the entire first surface on the opposite side to the substrate of the first insulation film;
    removing the organic molecules adsorbed to a first region defined as an inner side region not reaching an end part of the first insulation film including the display region on the first surface of the first insulation film;

forming a second insulation film in the first region removed of the organic molecules on the first insulation film;

removing the organic molecules adsorbed in regions apart from the first region of the first insulation film; and forming a third insulation film contacting the first insulation film at an outer side of the second insulation film above the first insulation film and the second insulation film.

2. The manufacturing method of a display device according to claim 1, wherein the organic molecules are removed by arranging a mask having an opening part for exposing the first region above the first insulation film and performing a plasma treatment.

3. The manufacturing method of a display device according to claim 2, wherein the plasma treatment is a glow discharge plasma treatment of a gas including oxygen.

4. The manufacturing method of a display device according to claim 1, wherein the organic molecules are molecules of one or a plurality of organic materials selected from phthalic ester, low molecular siloxane, phosphoric acid ester or dibutylhydroxytoluene.

5. The manufacturing method of a display device according to claim 4, wherein the organic molecules increase liquid repellency of a first surface of the first insulation film.

6. A manufacturing method of a display device, the method comprising:

forming a first insulation film above a region including a display region of a substrate having the display region arranged with a plurality of display elements;

adsorbing organic molecules to the first insulation film masking a first region defined as an inner side region not reaching an end part of the first insulation film including the display region on a first surface on the opposite side to the substrate of the first insulation film;

forming a second insulation film in the first region unadsorbed with the organic molecules on the first insulation film;

removing the organic molecules adsorbed in regions apart from the first region of the first insulation film; and forming a third insulation film contacting the first insulation film at an outer side of the second insulation film above the first insulation film and the second insulation film.

7. The manufacturing method of a display device according to claim 6, wherein the organic molecules are molecules of one or a plurality of organic materials selected from phthalic ester, low molecular siloxane, phosphoric acid ester or dibutylhydroxytoluene.

8. The manufacturing method of a display device according to claim 7, wherein the organic molecules increase liquid repellency of a first surface of the first insulation film.

9. A manufacturing method of a display device, the method comprising:

forming a first insulation film above a region including a display region of a substrate having the display region arranged with a plurality of display elements;

forming an adhesion film on a first insulation film masking regions other than a first region defined as an inner side region not reaching an end part of the first insulation film including the display region on a first surface on the opposite side to the substrate of the first insulation film;

forming a second insulation film in the first region formed with the adhesion film on the first insulation film; and forming a third insulation film contacting the first insulation film at an outer side of the second insulation film above the first insulation film and the second insulation film.

10. The manufacturing method of a display device according to claim 9, wherein the adhesion film is formed in the first region and not formed in a region further to the outside than the first region.

11. The manufacturing method of a display device according to claim 10, wherein the adhesion film is silicon oxide or amorphous silicon.

12. The manufacturing method of a display device according to claim 11, wherein the adhesion film increases adhesion of the second insulation film.

13. The manufacturing method of a display device according to claim 1, wherein an end part of the second insulation film is formed further to the outside than an end part of the display region, and an end part of the first insulation film and an end part of the third insulation film are formed further to the outside than an end part of the second insulation film.

14. The manufacturing method of a display device according to claim 13, wherein the substrate has a drive circuit region including a drive circuit, and the first region is formed on the outer side of the drive circuit region.

15. The manufacturing method of a display device according to claim 14, wherein an end part of the second insulation film is formed between and end part of the display region and an end part of the drive circuit region.

16. The manufacturing method of a display device according to claim 15, wherein the second insulation film is formed by an inkjet method.

17. The manufacturing method of a display device according to claim 16, wherein the second insulation film is formed using an organic insulation material.

* * * * *